United States Patent
He et al.

(10) Patent No.: US 12,456,647 B2
(45) Date of Patent: Oct. 28, 2025

(54) NANOSHEET TRANSISTOR DEVICES AND RELATED FABRICATION METHODS

(71) Applicant: Samsung Electronics Co., Ltd., Suwon-si (KR)

(72) Inventors: Ming He, San Jose, CA (US); JaeHyun Park, Hwaseong-si (KR); Chihak Ahn, Fremont, CA (US); Mehdi Saremi, Danville, CA (US); Rebecca Park, Mountain View, CA (US); Harsono Simka, Saratoga, CA (US); Daewon Ha, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 801 days.

(21) Appl. No.: 17/679,465

(22) Filed: Feb. 24, 2022

(65) Prior Publication Data

US 2023/0178420 A1    Jun. 8, 2023

Related U.S. Application Data

(60) Provisional application No. 63/285,599, filed on Dec. 3, 2021.

(51) Int. Cl.
*H10D 30/67* (2025.01)
*H01L 21/76* (2006.01)
(Continued)

(52) U.S. Cl.
CPC ... *H01L 21/76283* (2013.01); *H10D 30/6735* (2025.01); *H10D 30/6757* (2025.01); *H10D 62/118* (2025.01); *H10D 64/015* (2025.01)

(58) Field of Classification Search
CPC ........... H01L 21/76283; H01L 29/0665; H01L 29/42392; H01L 29/6653; H01L 29/78696; H01L 21/00; H01L 21/02; H01L 21/02104; H01L 21/02107; H01L 21/02109; H01L 21/02293; B82Y 10/00; H10D 62/118; H10D 62/119; H10D 64/015; H10D 64/01; H10D 30/00; H10D 30/01; H10D 30/019; H10D 62/01; H10D 62/00
(Continued)

(56) References Cited

U.S. PATENT DOCUMENTS 10,797,163 B1   10/2020  Yu et al.
10,840,366 B2   11/2020  Cea et al.
(Continued)

OTHER PUBLICATIONS

Zhang et al. "Full Bottom Dielectric Isolation to Enable Stacked Nanosheet Transistor for Low Power and High Performance Applications" 2019 IEEE International Electron Devices Meeting (IEDM) 11.6.1-11.6.4 (Dec. 2019).

*Primary Examiner* — Monica D Harrison
(74) *Attorney, Agent, or Firm* — Myers Bigel, P.A.

(57) ABSTRACT

Methods of forming transistor devices are provided. A method of forming a transistor device includes providing a nanosheet stack that includes a plurality of nanosheets on a substrate. A sacrificial layer is between the nanosheet stack and the substrate. The method includes removing the sacrificial layer to form an opening between the nanosheet stack and the substrate. The method includes forming a gate spacer and an isolation region by forming an insulating material on the nanosheet stack and in the opening, respectively. Related transistor devices are also provided.

16 Claims, 28 Drawing Sheets

(51) Int. Cl.
*H01L 21/762* (2006.01)
*H10D 62/10* (2025.01)
*H10D 64/01* (2025.01)

(58) Field of Classification Search
USPC ........................................................ 257/401
See application file for complete search history.

(56) References Cited

U.S. PATENT DOCUMENTS

| | | |
|---|---|---|
| 11,145,761 B2 | 10/2021 | Sun et al. |
| 11,450,751 B2 * | 9/2022 | Su .................... H01L 21/76895 |
| 2019/0109040 A1 | 4/2019 | Chao et al. |
| 2019/0393214 A1 | 12/2019 | Lilak et al. |
| 2020/0303500 A1 | 9/2020 | Loubet et al. |
| 2021/0193532 A1 | 6/2021 | Van Dal et al. |
| 2021/0249506 A1 | 8/2021 | Yeh et al. |
| 2021/0296439 A1 | 9/2021 | Yang et al. |
| 2022/0013521 A1 | 1/2022 | Zhang et al. |
| 2023/0099214 A1 * | 3/2023 | Miao .................. H10D 30/6757 257/288 |

* cited by examiner

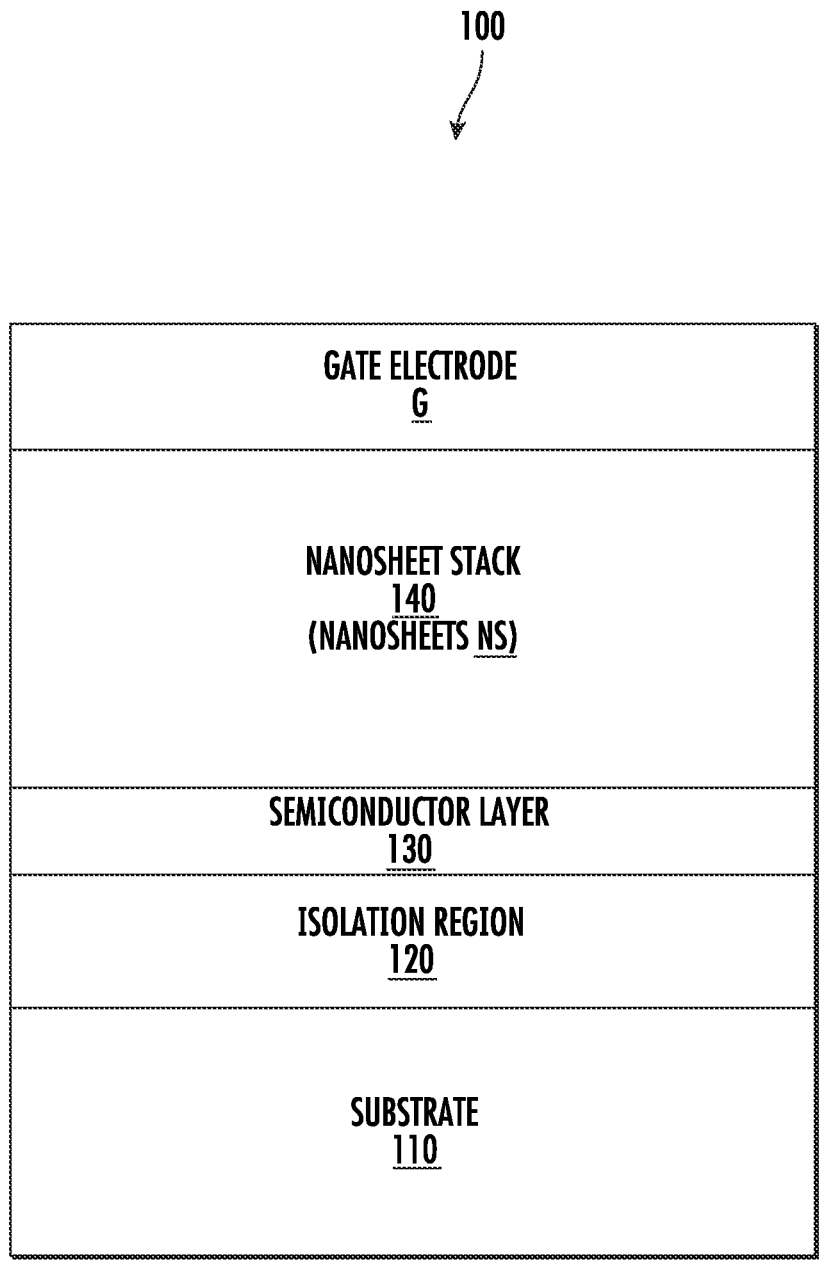
FIG. 1A
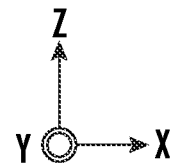

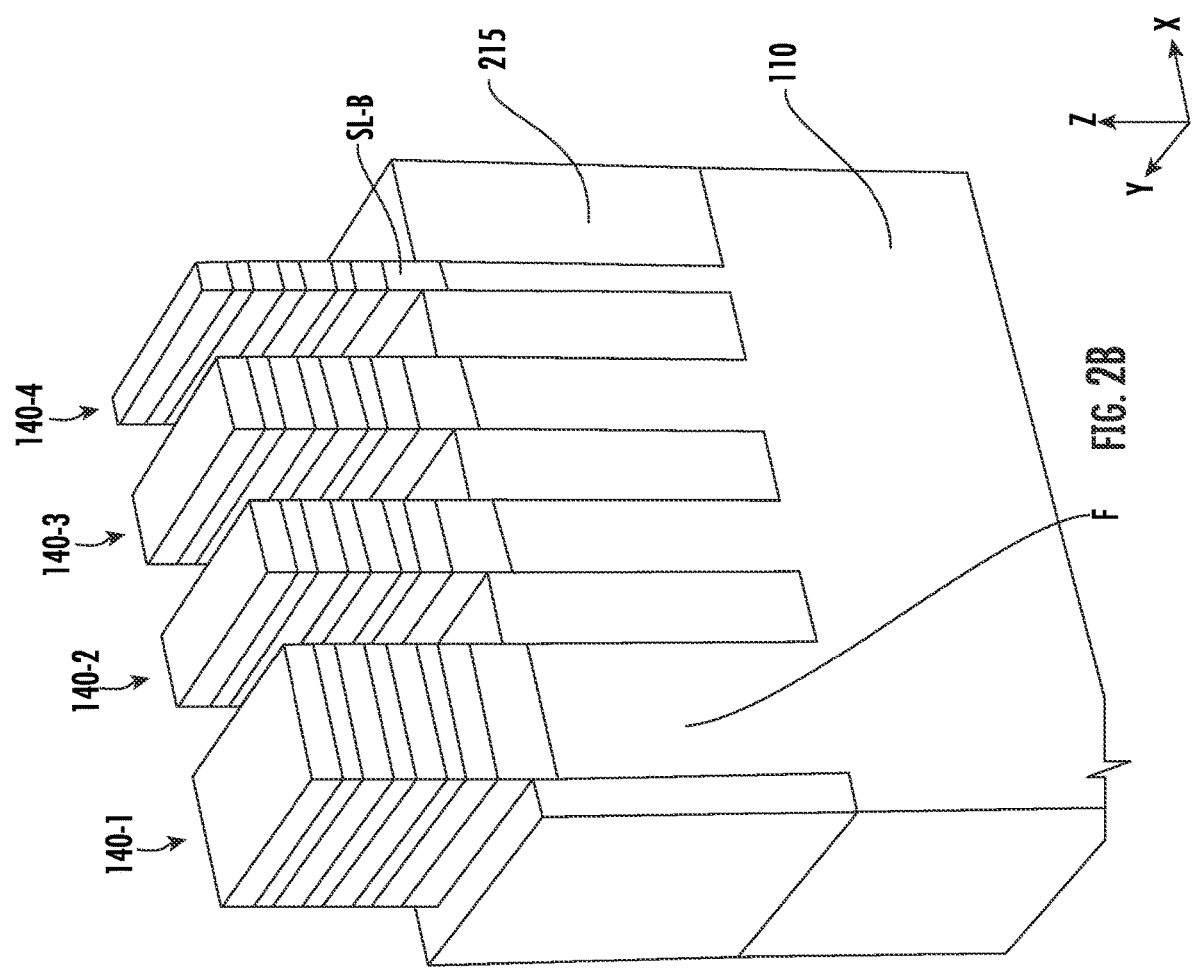

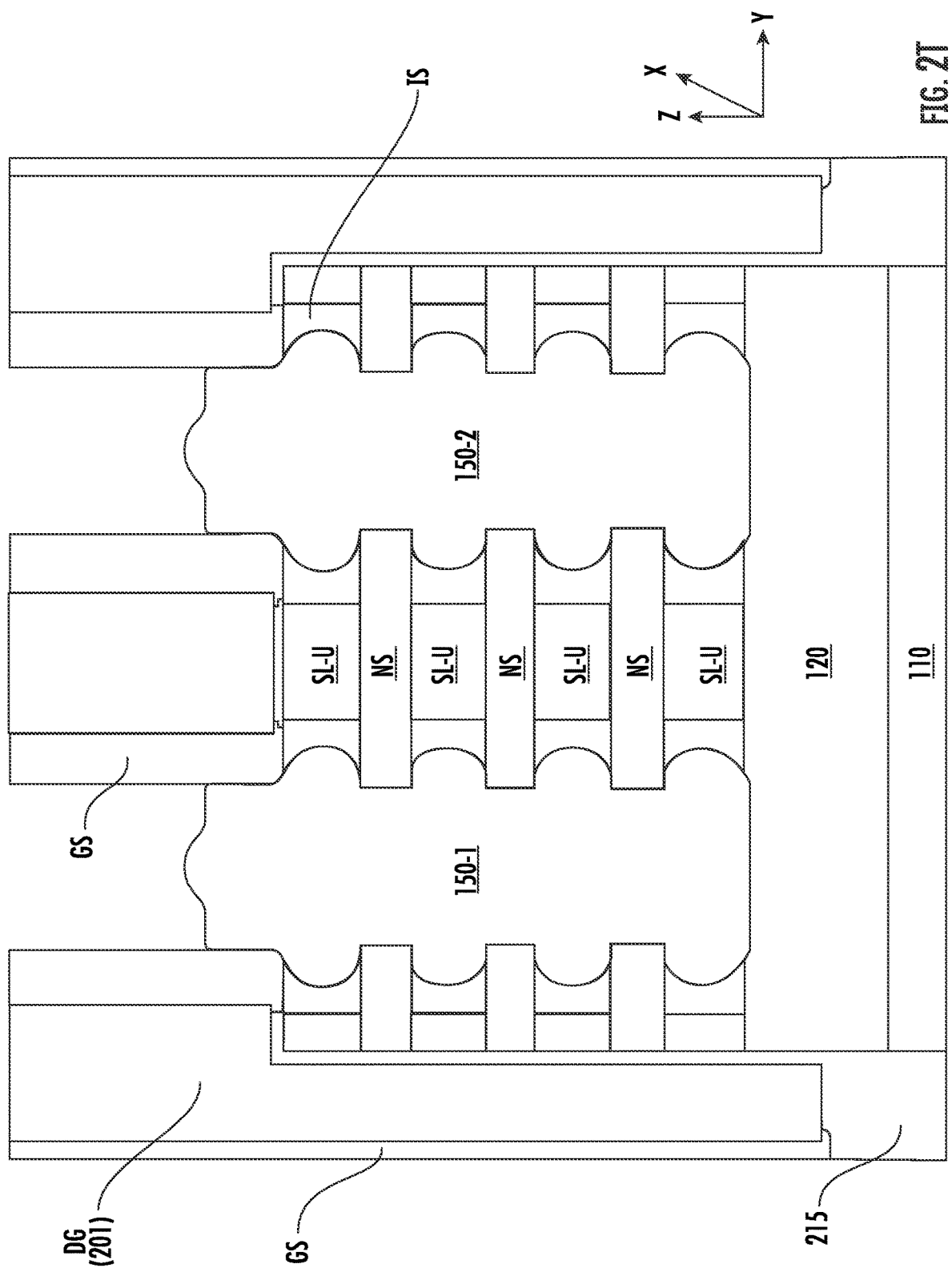

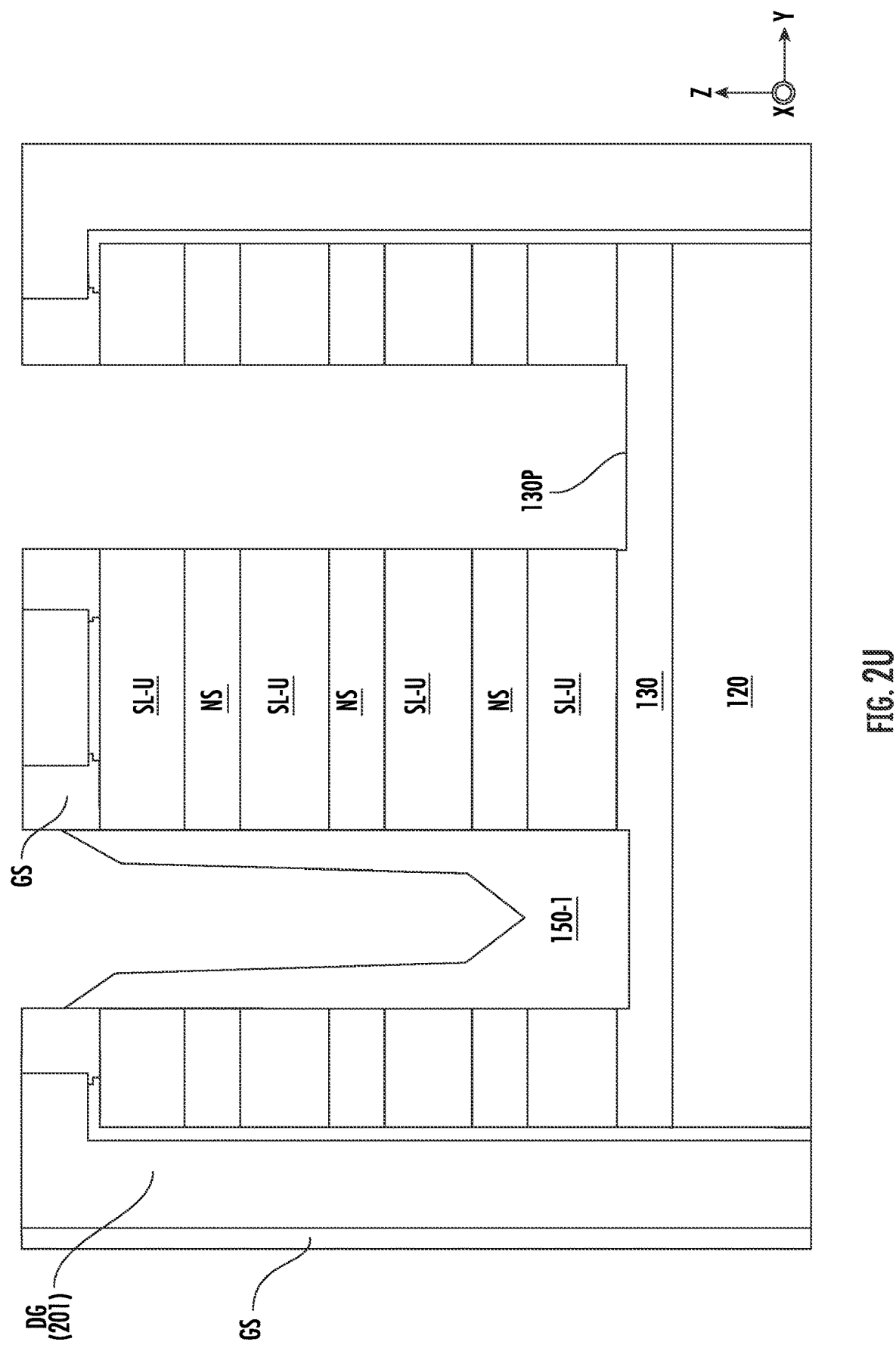

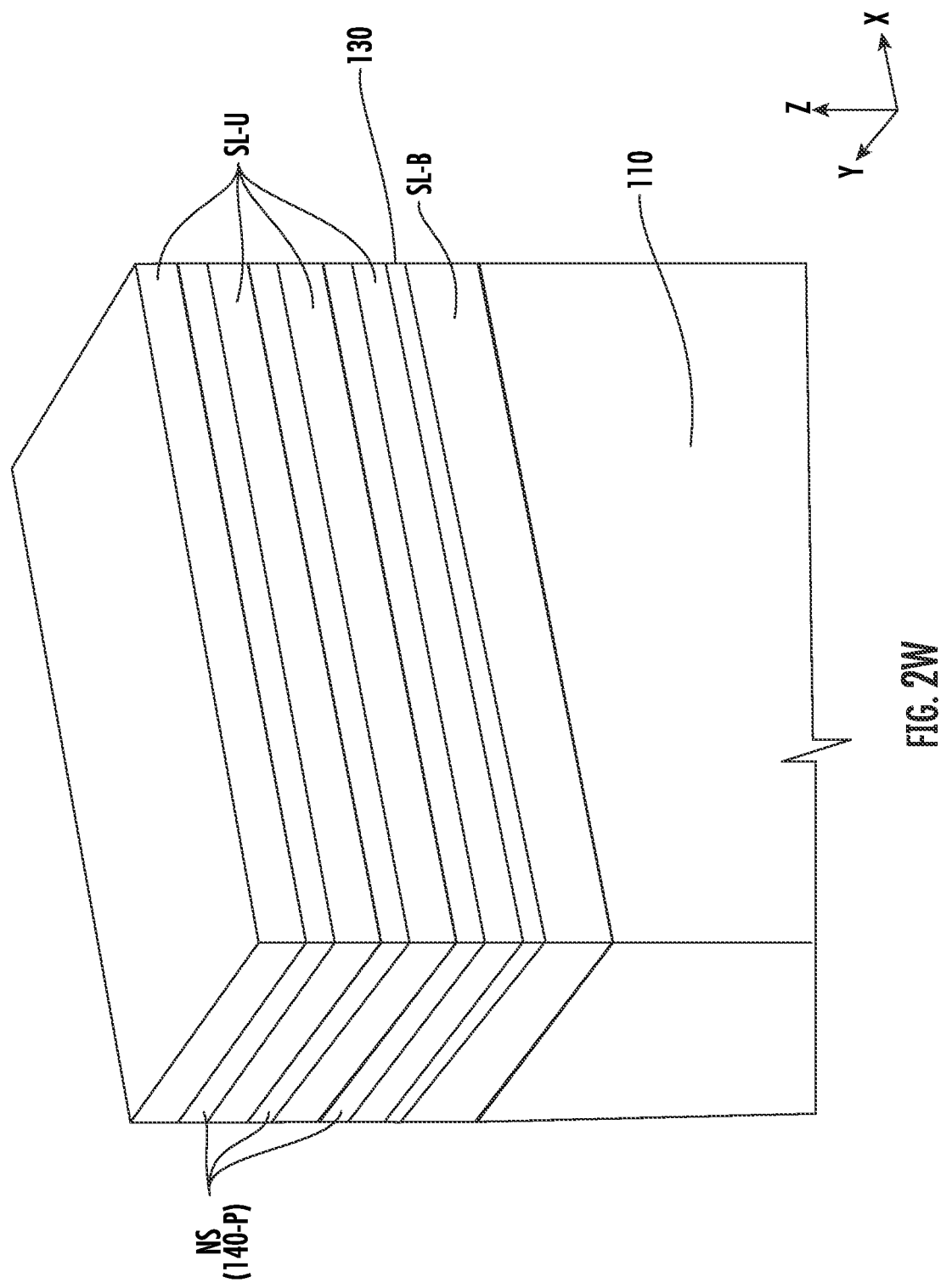

NANOSHEET TRANSISTOR DEVICES AND RELATED FABRICATION METHODS

CLAIM OF PRIORITY

The present application claims the benefit of U.S. Provisional Patent Application Ser. No. 63/285,599, filed on Dec. 3, 2021, entitled BOTTOM DIELECTRIC ISOLATION FOR NANOSHEET DEVICES, the disclosure of which is hereby incorporated herein in its entirety by reference.

FIELD

The present disclosure generally relates to the field of semiconductor devices and, more particularly, to three-dimensional transistor structures.

BACKGROUND

For nanosheet transistor devices, a punch-through layer may be implanted below a stack of nanosheets to reduce current leakage with respect to a substrate below the stack. With continued scaling of gate length (e.g., to a narrow length), however, the effect of the punch-through layer may diminish, thereby resulting in increased leakage. Moreover, increased doping via punch-through implantation can increase device capacitance. A tradeoff thus exists between (a) reduced leakage and (b) increased device capacitance that can both result from punch-through implantation.

SUMMARY

A method of forming a transistor device, according to some embodiments herein, may include providing a sacrificial layer and a nanosheet stack on a substrate. The sacrificial layer may be between the nanosheet stack and the substrate. The nanosheet stack may include a plurality of nanosheets. The method may include removing the sacrificial layer to form an opening between the nanosheet stack and the substrate. Moreover, the method may include forming a gate spacer and an isolation region by concurrently forming an insulating material on the nanosheet stack and in the opening, respectively.

A method of forming a transistor device, according to some embodiments herein, may include providing a sacrificial layer and a nanosheet stack on a substrate. The sacrificial layer may be between the nanosheet stack and the substrate. The nanosheet stack may include a plurality of nanosheets. The method may include epitaxially growing a semiconductor layer from the sacrificial layer. The method may include removing the sacrificial layer to form an opening between the semiconductor layer and the substrate. Moreover, the method may include forming an isolation region by forming an insulating material in the opening.

A transistor device, according to some embodiments herein, may include a substrate. The transistor device may include a source region and a drain region on the substrate. The transistor device may include a nanosheet stack that includes a plurality of nanosheets between the source region and the drain region. The transistor device may include an isolation region that is between the substrate and the nanosheet stack. Moreover, the transistor device may include a semiconductor layer that is between the isolation region and the nanosheet stack.

BRIEF DESCRIPTION OF THE DRAWINGS

FIGS. 1A and 1B are schematic block diagrams of a nanosheet transistor device according to some embodiments of the present invention.

FIGS. 2A-2W are views illustrating operations of forming a nanosheet transistor device according to some embodiments of the present invention. FIGS. 2A and 2B are side perspective views. FIGS. 2F-2R are side perspective views. FIGS. 2T and 2U are side perspective and side views, respectively, according to different embodiments. FIGS. 2V and 2W are side perspective views illustrating alternatives to the operation shown in FIG. 2A.

DETAILED DESCRIPTION

Pursuant to embodiments of the present invention, methods of forming nanosheet transistor devices are provided. For example, embodiments of the present invention can provide a bottom dielectric isolation region in a nanosheet transistor device (or in a multi-bridge channel device). The isolation region can reduce device capacitance and leakage current without compromising gate length scaling. In some embodiments, the isolation region may be formed as part of a deposition (e.g., atomic layer deposition ("ALD")) process that forms gate spacers. Moreover, a thin semiconductor layer may, in some embodiments, be formed on top of the isolation region to improve source/drain epitaxial crystallinity and act as an additional channel region of a transistor to boost the device drive.

Example embodiments of the present invention will be described in greater detail with reference to the attached figures.

Figure 1B:
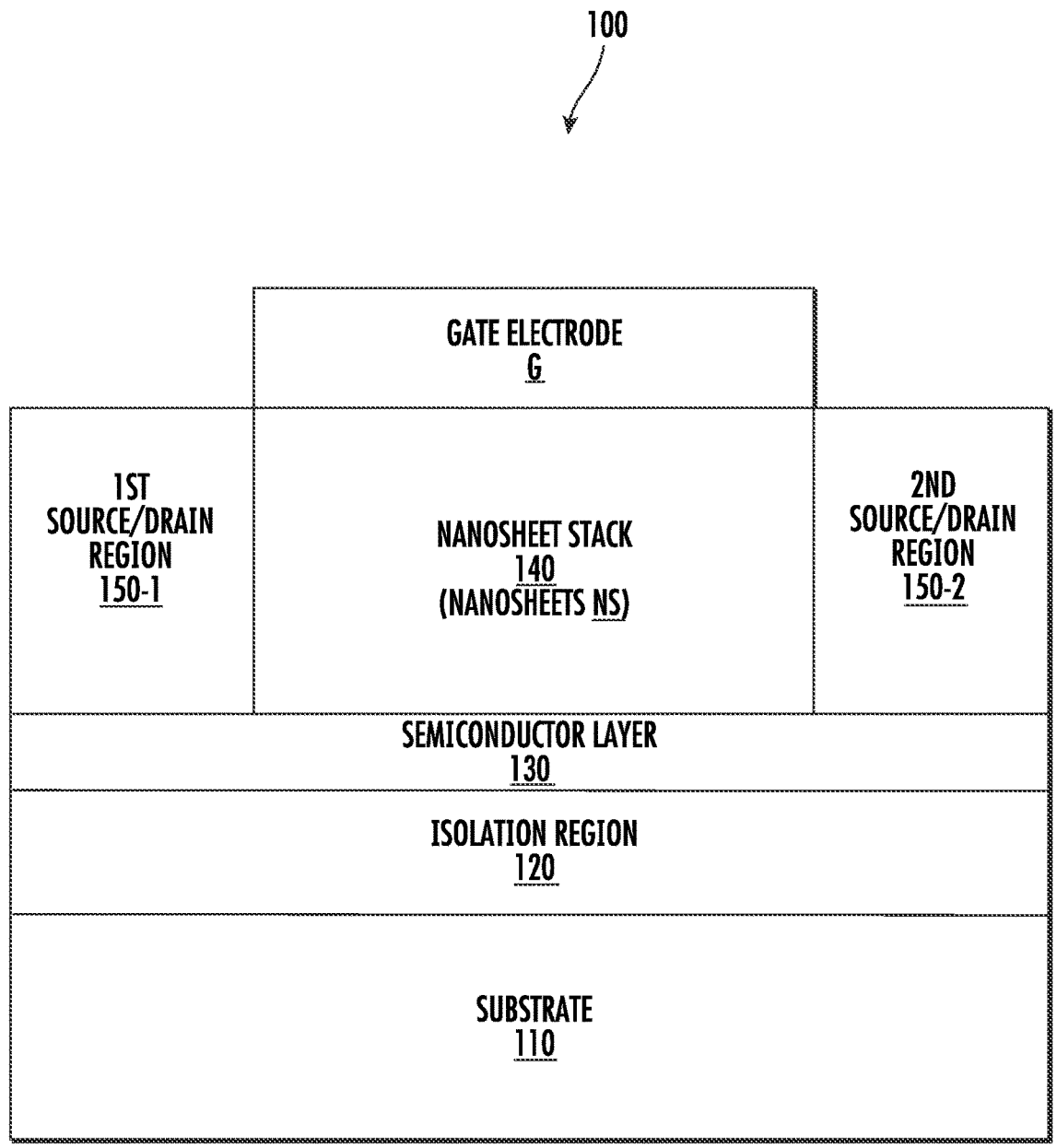

FIGS. 1A and 1B are schematic block diagrams of a nanosheet transistor device 100 according to some embodiments of the present invention. The device 100 includes a substrate 110, a nanosheet stack 140 on the substrate 110, and an isolation region 120 that is between the stack 140 and the substrate 110. In some embodiments, the substrate 110 may include the same material as a plurality of nanosheets NS that are in the stack 140. For example, the substrate 110 may be a bulk silicon ("Si") substrate and the nanosheets NS may be respective Si sheets.

The isolation region 120 may be referred to herein as a "bottom isolation region" or a "bottom dielectric isolation region," as the isolation region 120 may be adjacent an upper surface of the substrate 110 and lower than any of the nanosheets NS. Moreover, the isolation region 120 may include the same insulating material 225 (FIG. 2M) as a gate spacer GS (FIG. 2M) of the device 100. As an example, the insulating material 225 may comprise oxide or nitride. For simplicity of illustration, the gate spacer GS is omitted from view in FIGS. 1A and 1B.

In some embodiments, a semiconductor layer 130 may be between the isolation region 120 and the stack 140. The semiconductor layer 130 may comprise, for example, silicon. Moreover, the semiconductor layer 130 may, in some embodiments, extend continuously from a lower surface of a first source/drain region (e.g., a source region) 150-1 to a lower surface of a second source/drain region (e.g., a drain region) 150-2, as shown in FIG. 1B. In other embodiments, the semiconductor layer 130 may be omitted from the device 100.

The nanosheets NS are between, and electrically connected to, the source/drain regions 150-1, 150-2. The nanosheets NS may thus function as respective channel regions of a transistor. The channel regions extend longitudinally in a horizontal direction Y. A gate electrode G (e.g., a metal gate) that extends longitudinally in another horizontal direction X (e.g., a direction perpendicular to the direction Y) is on the nanosheets NS. As an example, the gate electrode G may be implemented in a gate-all-around ("GAA") transistor, and thus may surround each of the nanosheets NS. For simplicity of illustration, the gate electrode G is shown only on top of the stack 140 in FIGS. 1A and 1B. In some embodiments, however, the gate electrode G may be on side surfaces of the stack 140 and/or may be between (in a vertical direction Z) adjacent ones of the nanosheets NS.

The gate electrode G may be on an upper surface of the isolation region 120 and/or the semiconductor layer 130. Moreover, a lower surface of the semiconductor layer 130 that is opposite the upper surface thereof may contact the upper surface of the isolation region 120. In some embodiments, the gate electrode G may be on a first (e.g., middle) portion of the upper surface of the semiconductor layer 130, and second (e.g., left) and third (e.g., right) portions of the upper surface of the semiconductor layer 130 may contact respective lower surfaces of the first and second source/drain regions 150-1, 150-2.

For simplicity of illustration, only one device 100 is shown in FIGS. 1A and 1B. It will be understood, however, that operations described herein with respect to FIGS. 2A-2W and 3A-3C may be used to simultaneously form the device 100 along with other nanosheet transistor devices 100, and/or to simultaneously form a plurality of transistors (e.g., having respective nanosheet stacks 140) in the same device 100. Moreover, some of the devices 100/stacks 140 may have different widths from each other along the direction X.

Figure 2A:
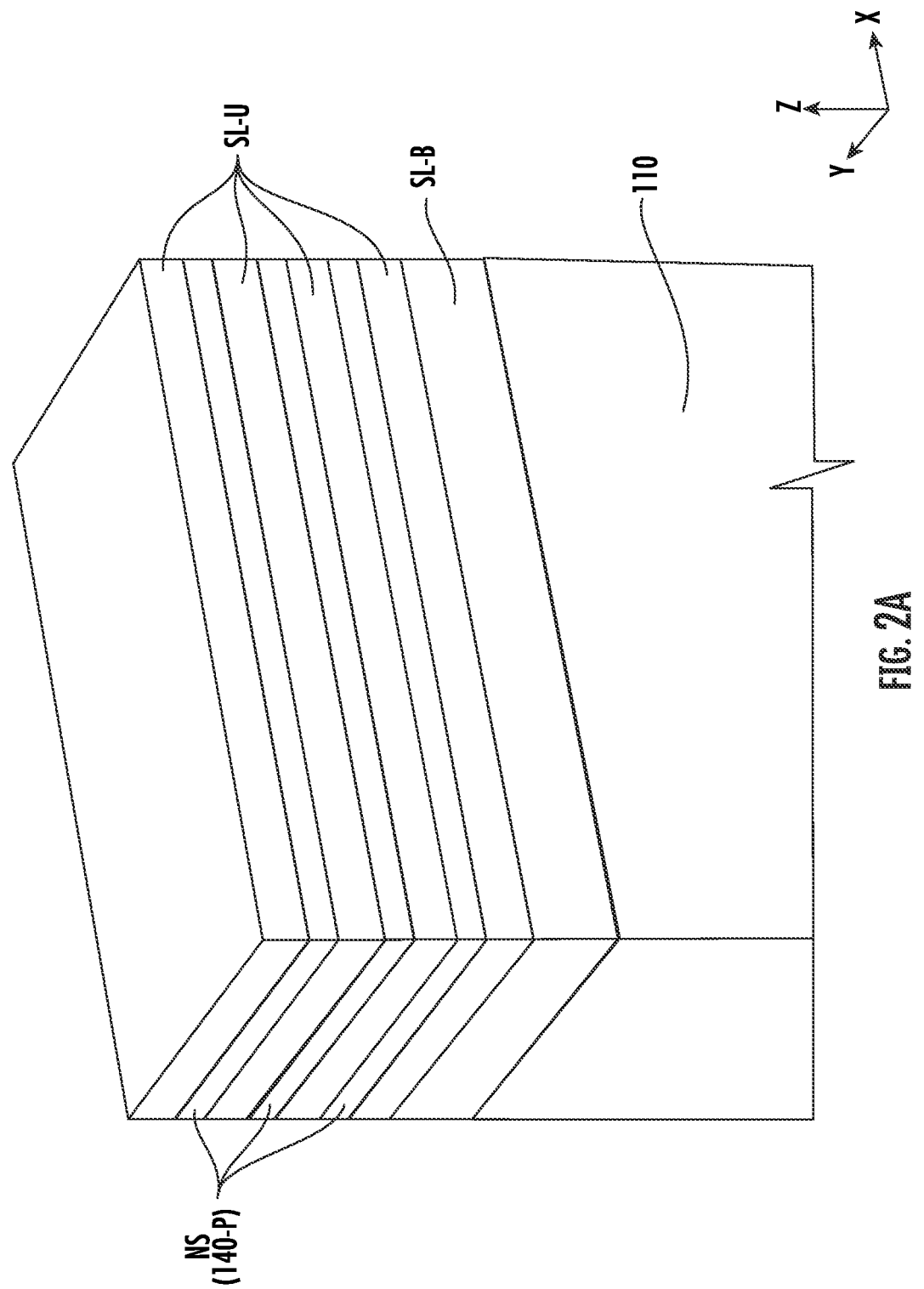
Figure 3A:
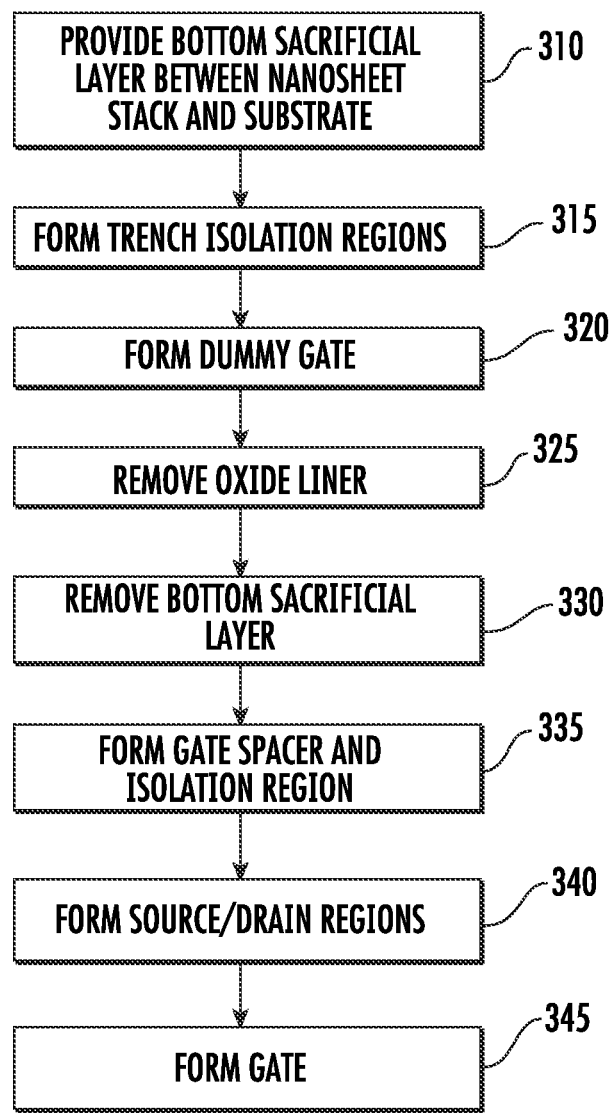
FIGS. 3A-3C are flowcharts corresponding to the operations shown in FIGS. 2A-2W.
Figure 3B:
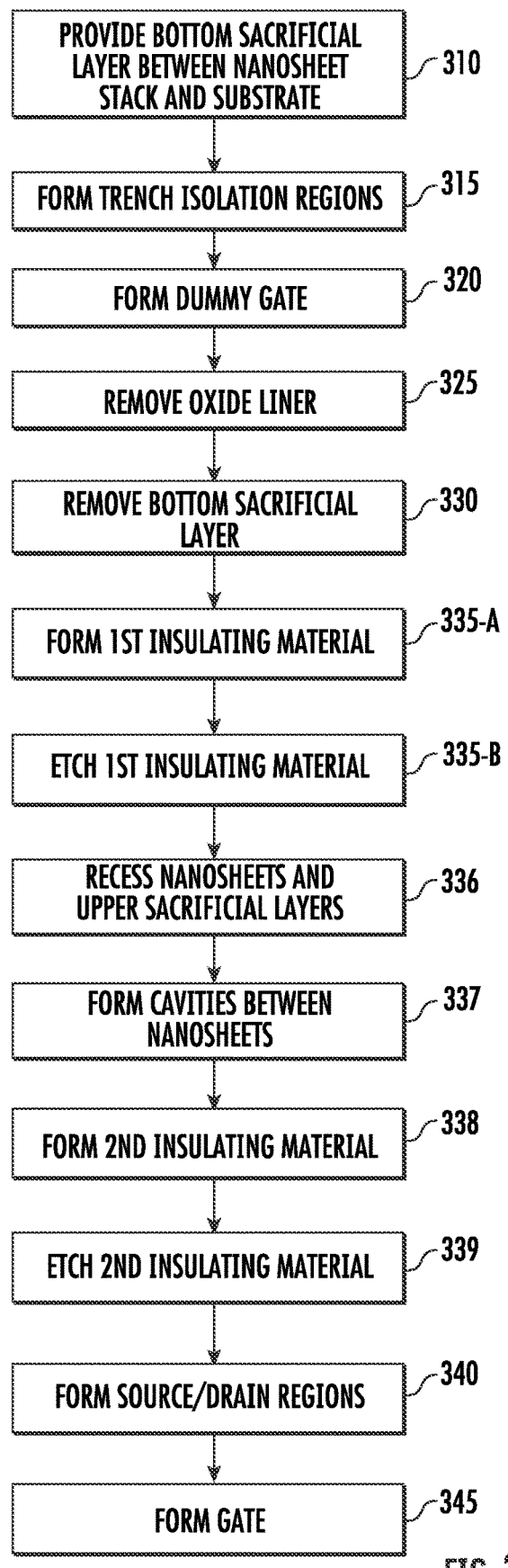
Figure 3C:
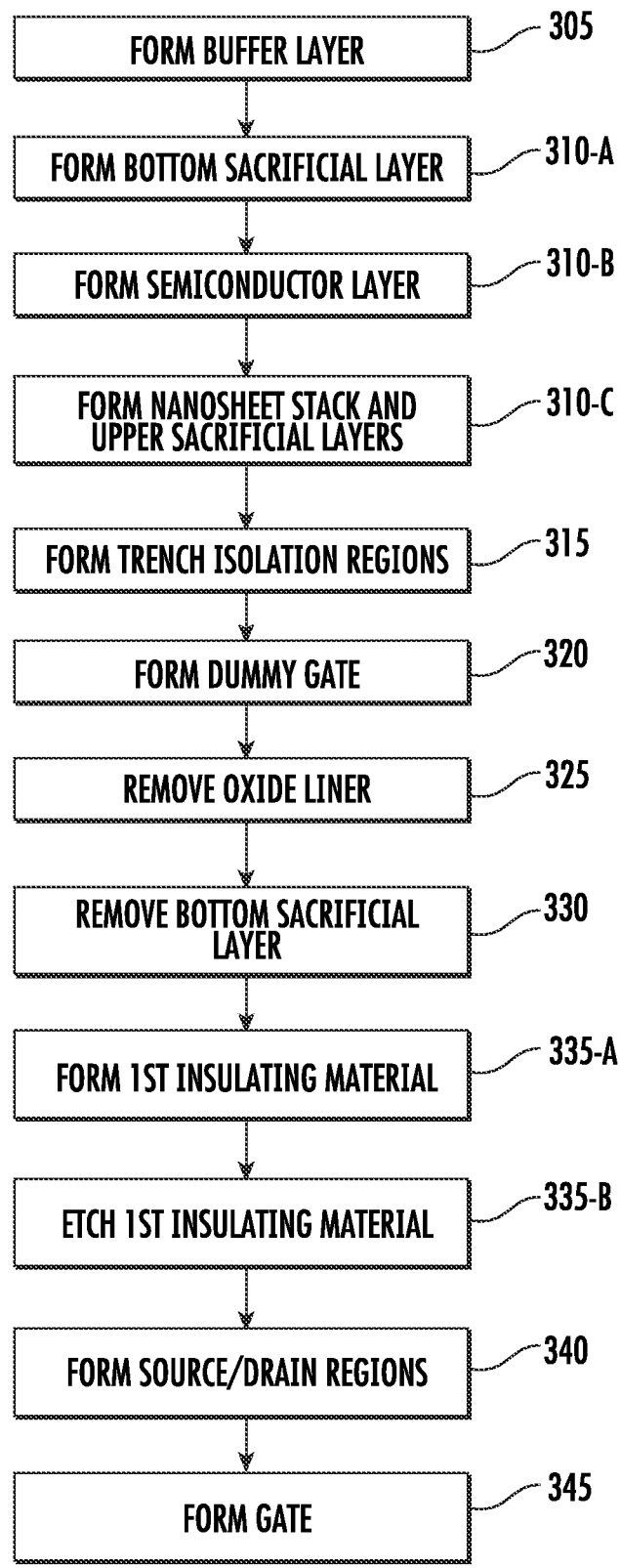

FIGS. 2A-2W are views illustrating operations of forming a nanosheet transistor device 100 (FIGS. 1A and 1B) according to some embodiments of the present invention. FIGS. 3A-3C are flowcharts corresponding to the operations shown in FIGS. 2A-2W.

FIGS. 2A and 2B are side perspective views. As shown in FIGS. 2A and 3A, a bottom sacrificial layer SL-B may be provided (Block 310) between a preliminary nanosheet stack 140-P and a substrate 110. Moreover, a plurality of upper sacrificial layers SL-U may alternate with nanosheets NS of the stack 140-P. The bottom sacrificial layer SL-B will subsequently be replaced by an isolation region 120 (FIG. 2P). In some embodiments, the bottom sacrificial layer SL-B may have etch selectivity with respect to the upper sacrificial layers SL-U, and with respect to the nanosheets NS. For example, the bottom sacrificial layer SL-B and the upper sacrificial layers SL-U may each comprise silicon germanium ("SiGe"), and the bottom sacrificial layer SL-B may have a higher Ge concentration than the upper sacrificial layers SL-U. As a result, the bottom sacrificial layer SL-B may subsequently be removed (FIG. 2H) while having no more than a minor impact on the upper sacrificial layers SL-U and the nanosheets NS.

The bottom sacrificial layer SL-B can have a thickness of 5-50 nm. In some embodiments, the bottom sacrificial layer SL-B may be as thin as the upper sacrificial layer SL-U or each of the nanosheets NS, or may be much thicker. As an example, the bottom sacrificial layer SL-B may be thicker, in the vertical direction Z, than each of the upper sacrificial layers SL-U. For example, the bottom sacrificial layer SL-B may have a vertical thickness of about 10 nanometers ("nm"), and the upper sacrificial layers SL-U may each have a vertical thickness of about 8 nm. The nanosheets NS may each have a vertical thickness of about 5 nm. The bottom sacrificial layer SL-B may thus be at least twice as thick (or even at least three times as thick), in the direction Z, as each of the nanosheets NS.

Referring to FIG. 3C, the bottom sacrificial layer SL-B may, in some embodiments, be formed (Block 310-A) by SiGe deposition on an upper surface of the substrate 110. For example, a low deposition temperature (e.g., less than 500 degrees Celsius) may enable deposition of a SiGe layer having a relatively high concentration of Ge. Moreover, substitutional carbon doping may be performed to reduce lattice strain, and thus to inhibit crystal defect generation as a result of forming the bottom sacrificial layer SL-B.

FIGS. 2B and 3A show that the preliminary nanosheet stack 140-P (FIG. 2A) may be etched (e.g., using an etch mask) to form four nanosheet stacks 140-1 through 140-4 that are spaced apart from each other in the direction X, and to form fin-shaped portions F (also referred to herein as "fins") of the substrate 110 that protrude upward in the direction Z toward the bottom sacrificial layer SL-B. Though four stacks 140-1 through 140-4 are shown as an example in FIG. 2B, a larger (e.g., five or more) or smaller (two or three) plurality of stacks 140 may be formed in some embodiments. Moreover, shallow trench isolation ("STI") regions 215 may be formed (Block 315) between, in the direction X, the fins F. The STI regions 215 may comprise, for example, an oxide material.

Figure 2C:
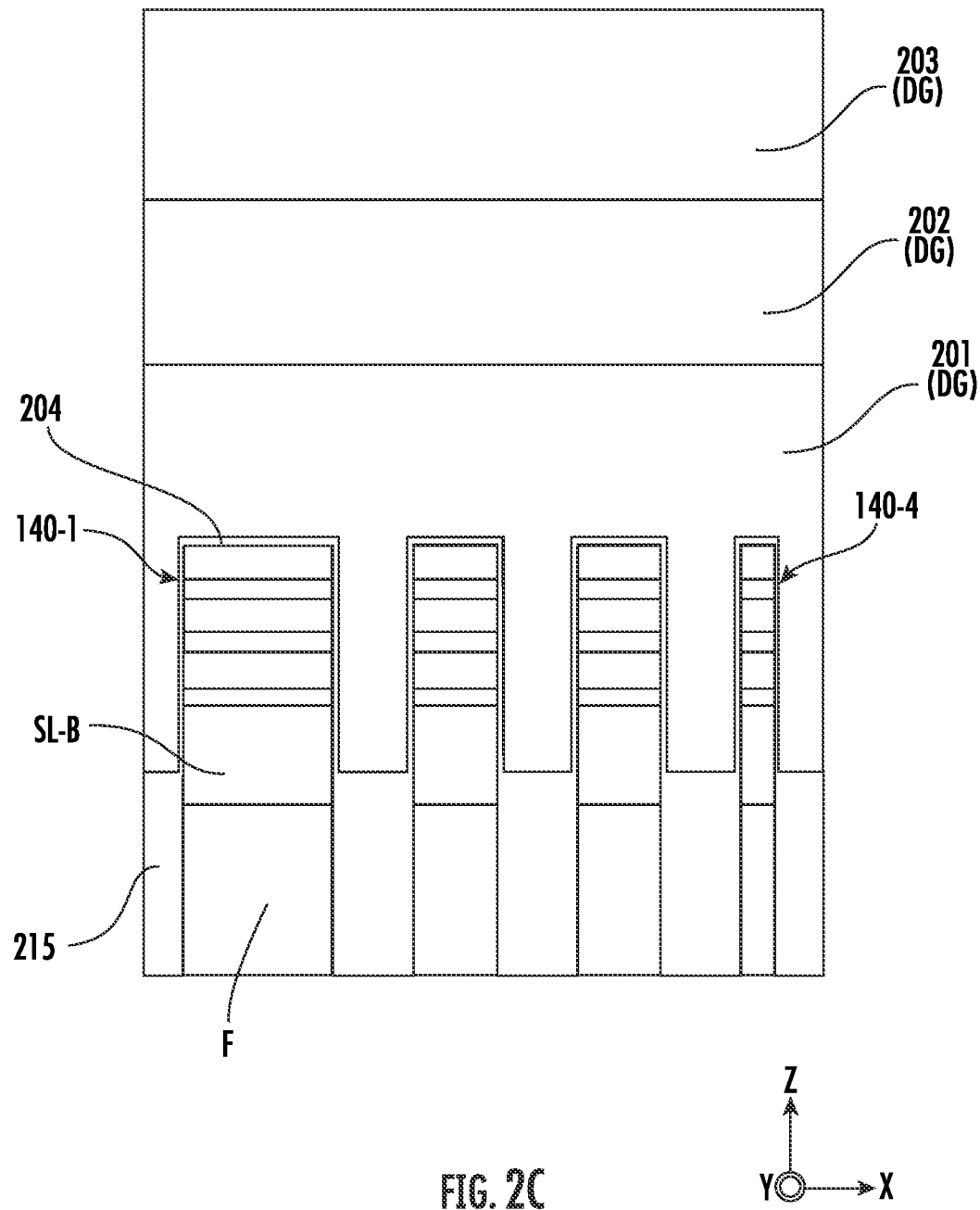
FIG. 2C is a side view.

FIG. 2C is a side view along the direction X. As shown in FIGS. 2C and 3A, a dummy gate DG may be formed (Block 320) on the nanosheet stacks 140-1 through 140-4. In some embodiments, the dummy gate DG may comprise multiple layers, such as three layers 201-203. The layer 201 may comprise, for example, an amorphous silicon ("a-Si") layer that is conformally formed on the stacks 140. As an example, the layer 201 may extend continuously from the stack 140-1 to the stack 140-4. Moreover, layers 202, 203 may be hardmask layers that are formed on the layer 201. As an example, the layers 202, 203 may comprise silicon nitride ("SiN") and oxide (e.g., silicon oxide or silicon oxynitride), respectively. The layer 202 may be between, in the direction Z, the layers 201, 203.

In some embodiments, an insulating liner 204 may be formed on portions of upper and side surfaces of the stacks 140 that are exposed by (e.g., that protrude outward in the direction Y beyond) the layer 201, as shown in the side view provided by FIG. 2C. The liner 204 may comprise, for example, the same material (e.g., silicon oxide or silicon oxynitride) as the layer 203.

Figure 2D:
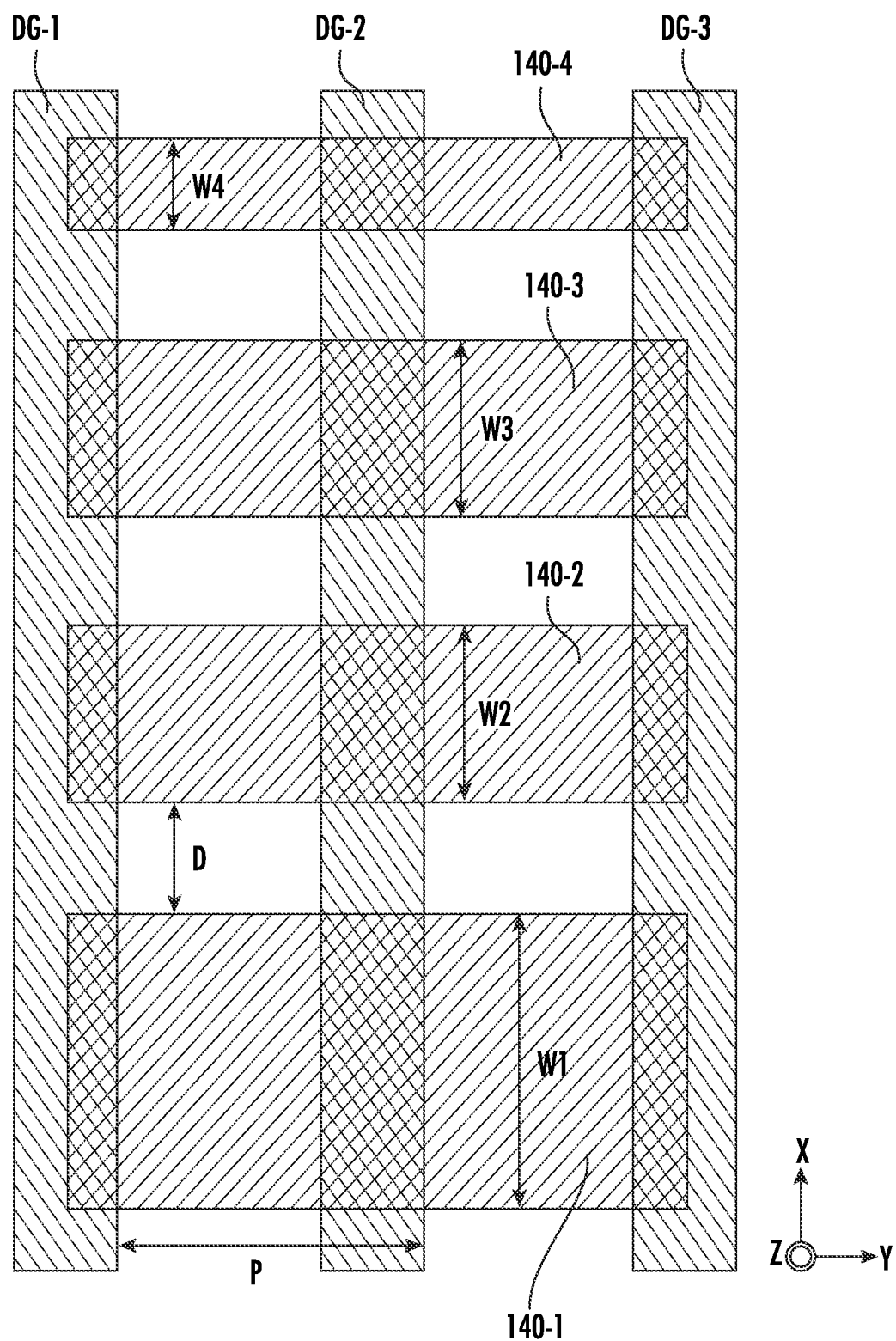
FIG. 2D is a plan view.

Referring to FIG. 2D, which is a plan view, a plurality of dummy gates DG may be on the nanosheet stacks 140 in some embodiments. As an example, three dummy gates DG-1 through DG-3 may be on each of the four stacks 140-1 through 140-4. The dummy gates DG extend longitudinally in the direction X and are spaced apart from each other in the direction Y. A pitch P of the dummy gates DG in the direction Y may be about 42 nm. Pairs of the stacks 140 may be spaced apart from each other in the direction X by a distance D, which may be about 15 nm. The four stacks 140-1 through 140-4 may have widths W1-W4 in the direction X of about 40 nm, about 24 nm, about 24 nm, and about 12 nm, respectively. Accordingly, operations herein may be used to form a nanosheet transistor device 100 (FIGS. 1A and 1B) having one or more of various nanosheet NS widths in the direction X. The operations thus may not be width sensitive. Moreover, these width, pitch, and distance dimensions are provided merely as examples, and some embodiments may have other width, pitch, and/or distance dimensions.

Figure 2E:
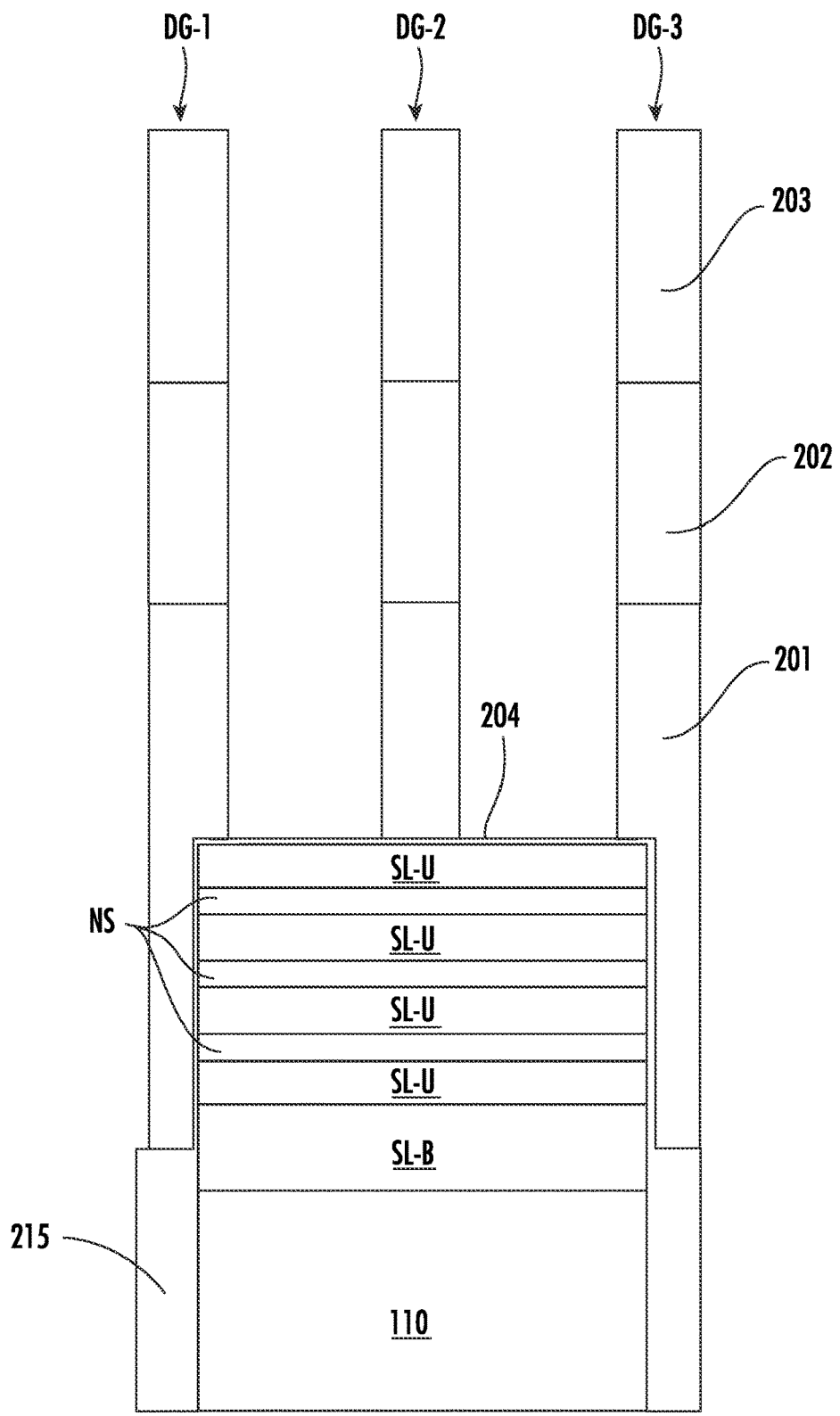
FIG. 2E is a side view.

FIG. 2E is a side view along the direction Y. As shown in FIG. 2E, the liner 204 may be on a portion of an upper surface of an uppermost one of the upper sacrificial layers SL-U that is exposed by (e.g., that is not overlapped in the direction Z by) the dummy gates DG.

Figure 2F:
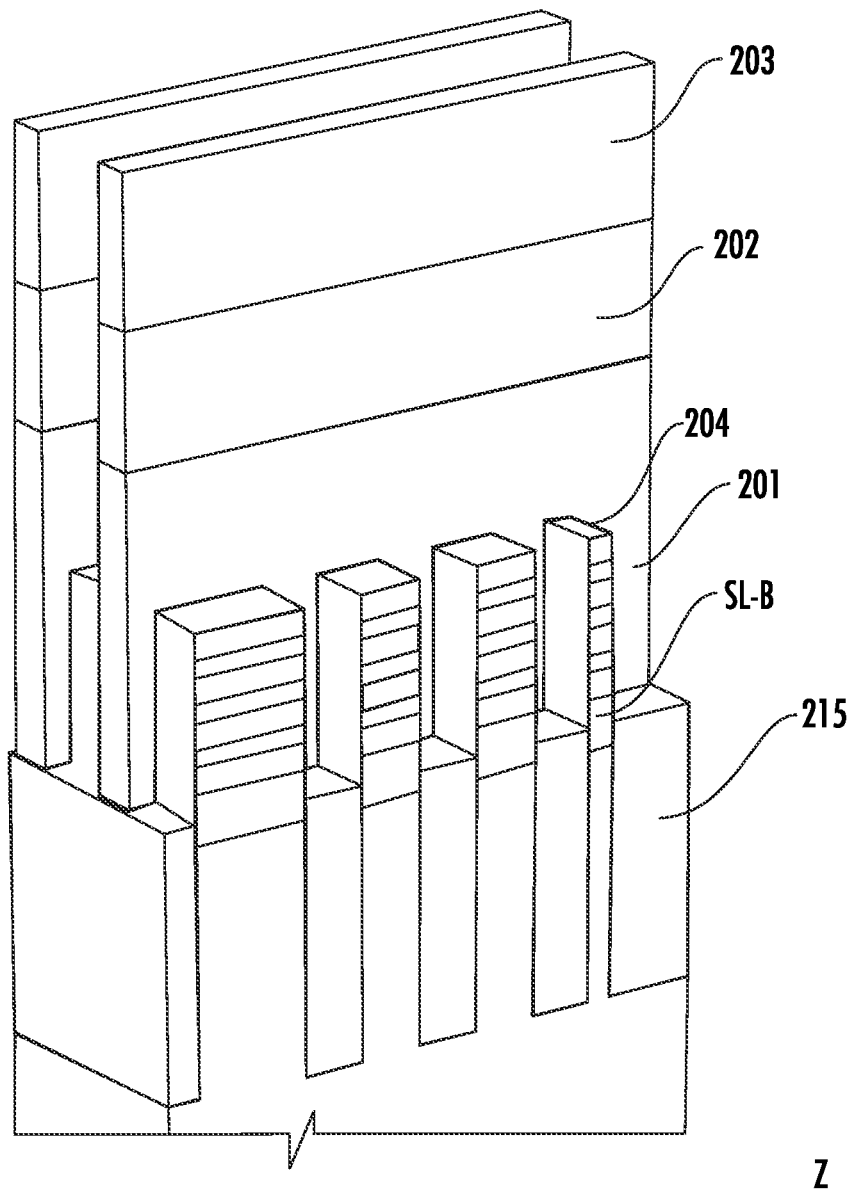

FIGS. 2F-2R are side perspective views. FIG. 2F shows that the liner 204 may protrude outward from a side surface of the layer 201 in the direction Y.

Figure 2G:
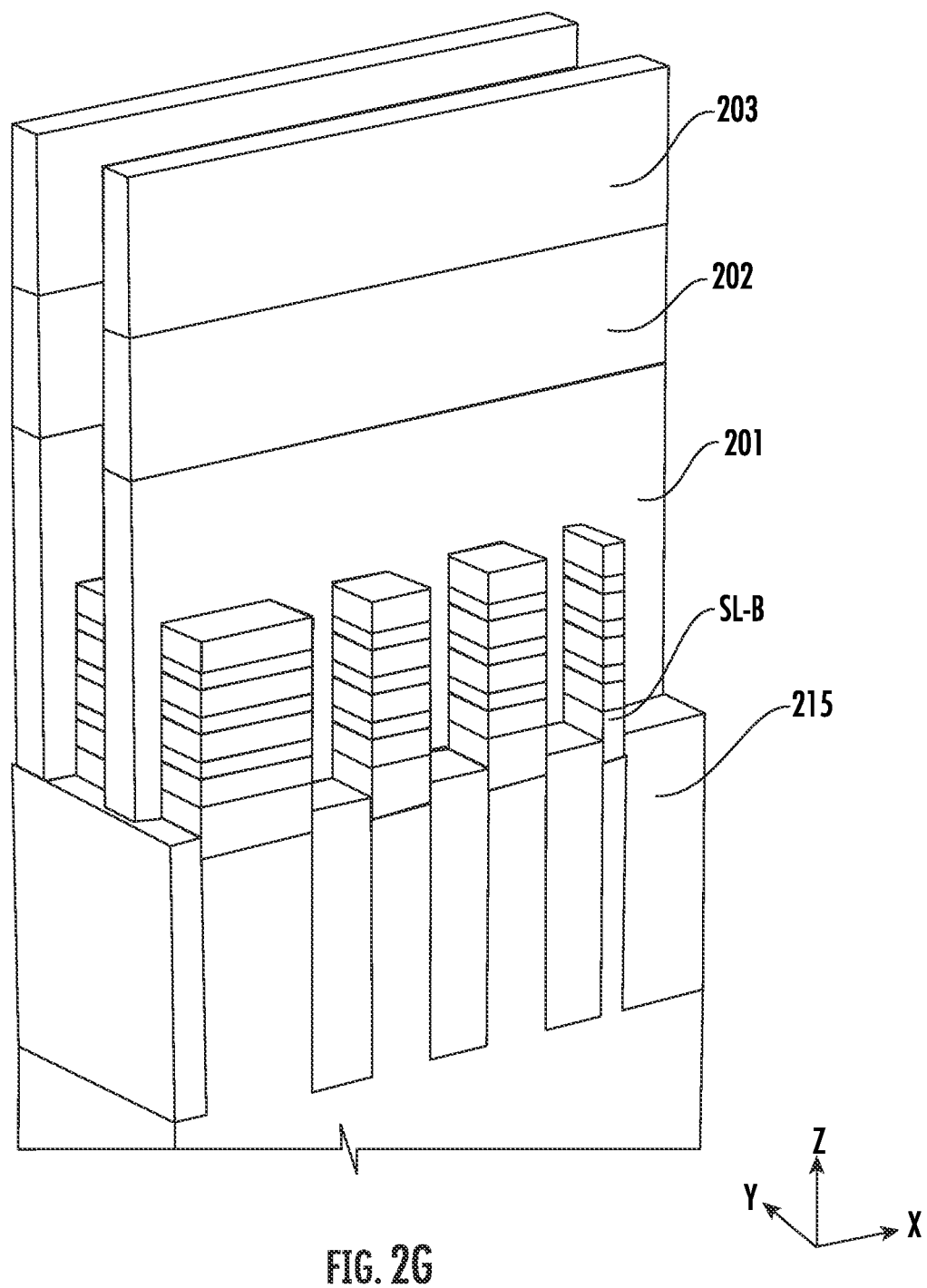

As shown in FIGS. 2G and 3A, the liner 204 may be removed (Block 325) while the layers 201-203 of the dummy gates DG remain. For example, even if the liner 204 has the same material as the layer 203, the liner 204 is much thinner than the layer 203, and thus may be removed without removing a substantial portion of the layer 203.

Figure 2H:
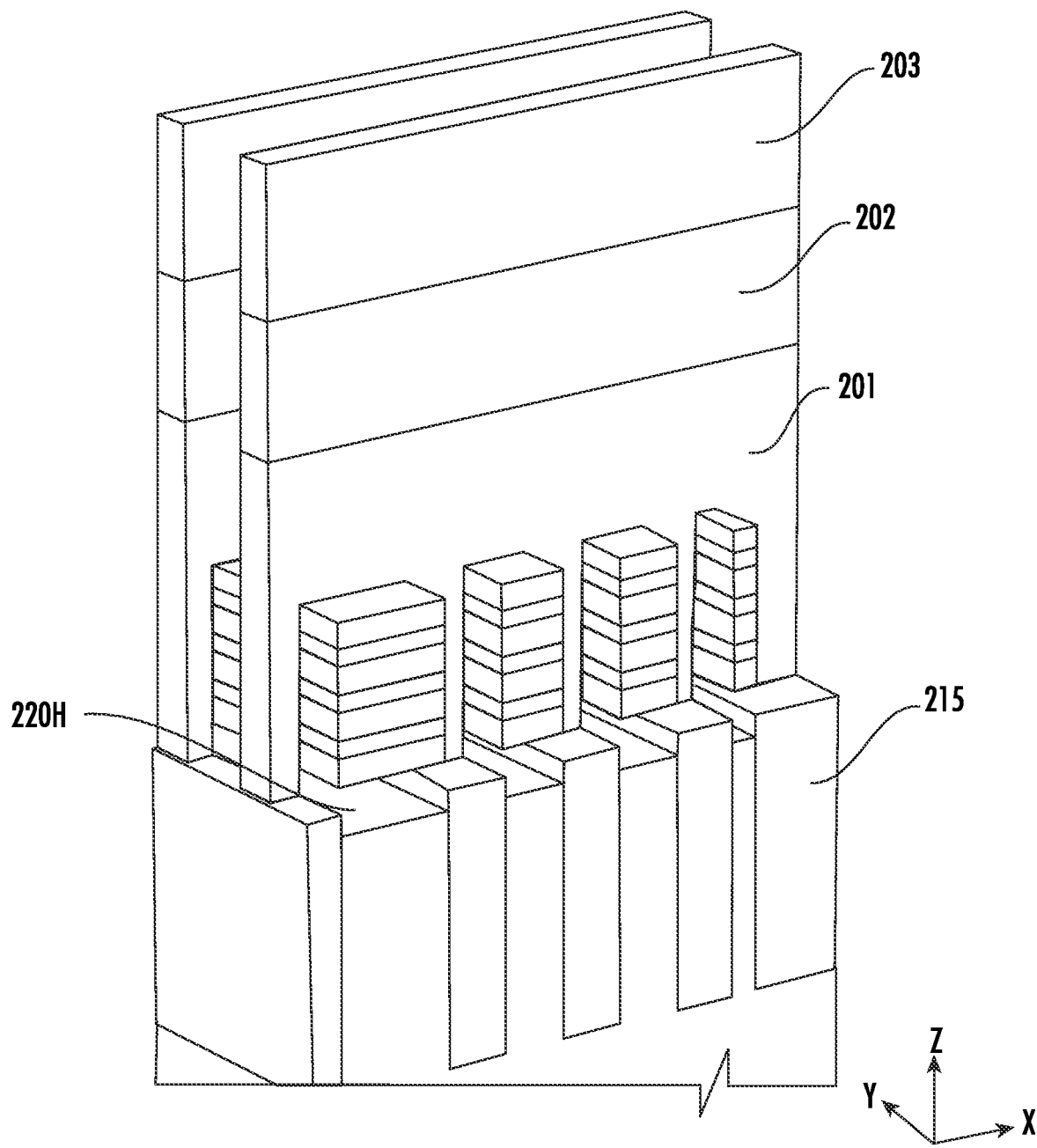
Figure 21:
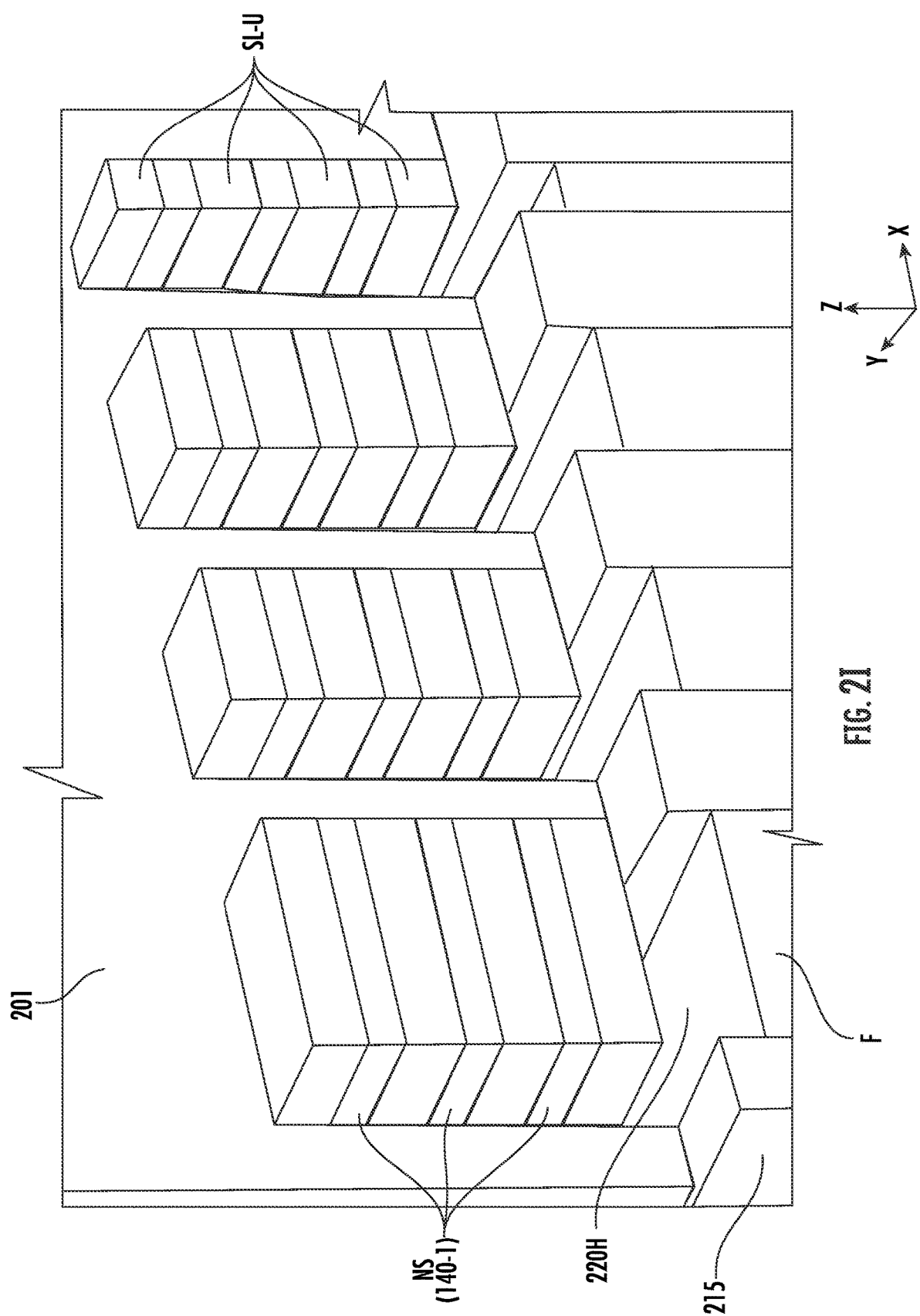

Referring to FIGS. 2H and 3A, the bottom sacrificial layer SL-B may be removed (Block 330), thus providing an opening 220H. As an example, the bottom sacrificial layer SL-B may be etched using an etchant such as a 1:4:20 ammonia peroxide mixture ("APM") at about 65 degrees Celsius.

FIG. 2I is an enlarged view of a portion of FIG. 2F. As shown in FIG. 2I, a respective opening 220H may be formed between each fin F and the respective nanosheet transistor stack 140 thereon. For example, each opening 220H may expose an upper surface of a fin F and a lower surface of a lowermost one of the upper sacrificial layers SL-U. The lowermost one of the upper sacrificial layers SL-U may contact a lower surface of a lowermost nanosheet NS of a stack 140.

Figure 2J:
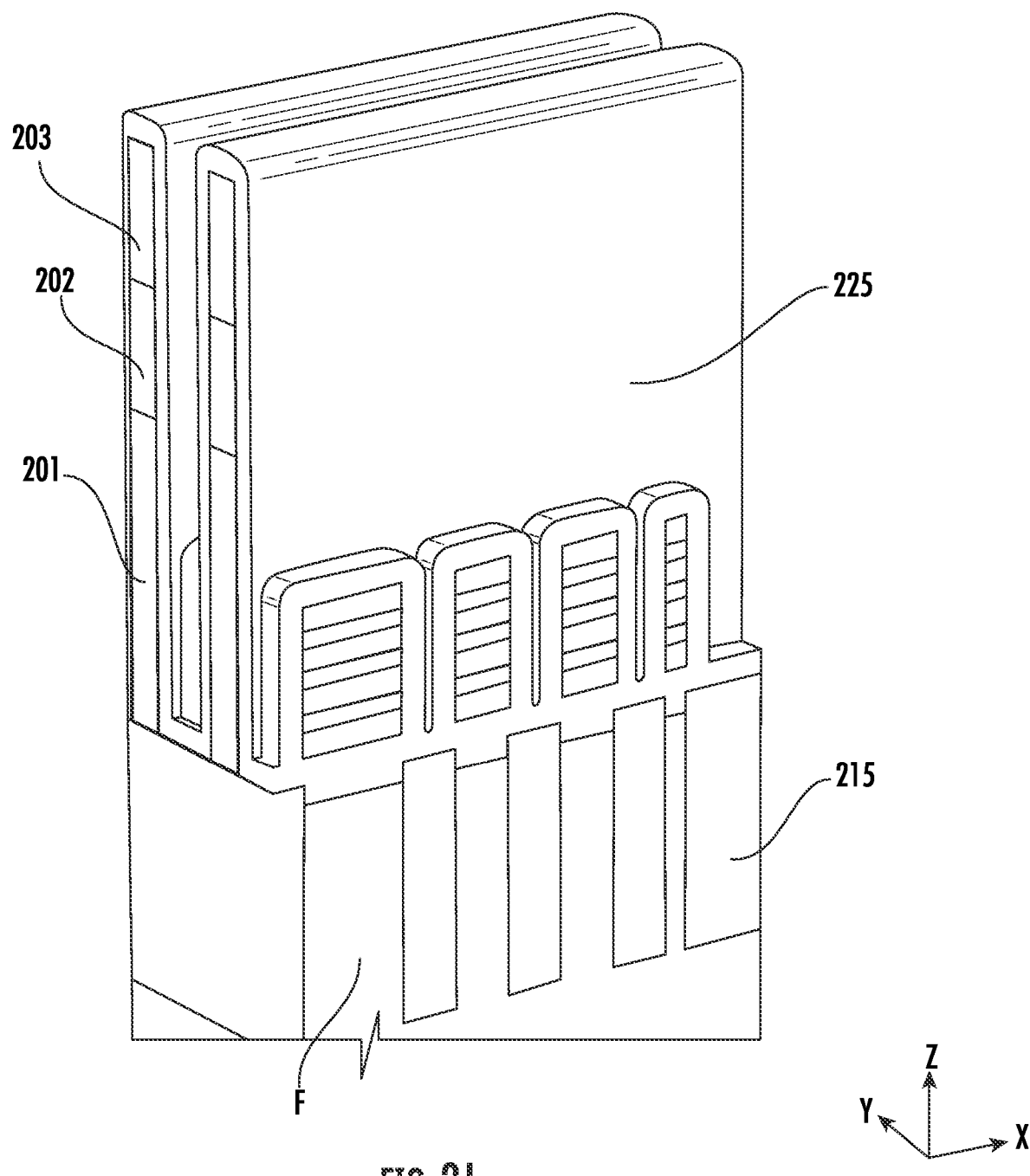

As shown in FIG. 2J, an insulating material 225 is formed on the nanosheet stacks 140 (FIG. 2I), on the layers 201-203 of the dummy gates DG (FIG. 2E), and in the openings 220H (FIG. 2I). For example, the insulating material 225 may be simultaneously/concurrently deposited, such as using the same ALD operation/process, (i) on sidewalls of the layers 201-203 and (ii) inside (e.g., to fill) the openings 220H. A thickness of the insulating material 225 may be selected to balance pinch-off considerations with respect to (a) source/drain gaps and (b) isolation regions 120 (FIG. 2M) that are inside respective openings 220H. In some embodiments, a cyclic deposition process for forming the insulating material 225 may help to control source/drain gap pinch-off. As an example, a cyclic deposition and etch process may deposit a thin layer uniformly everywhere, then perform an etch that is faster on top and sidewall regions but slow at the bottom of the openings 220H, to control the risk of pinch-off in source/drain gaps while pinching off the openings 220H.

Figure 2K:
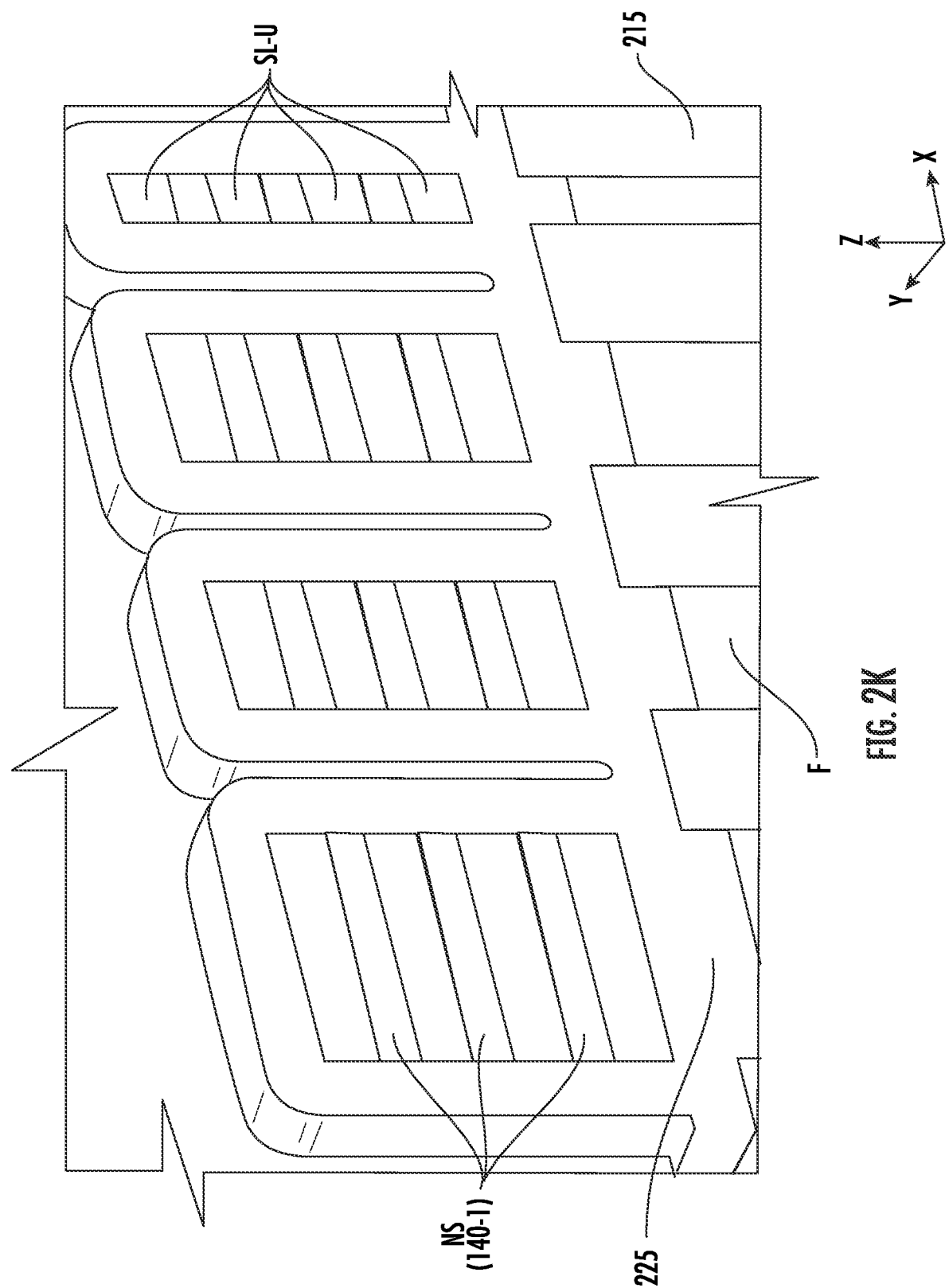

FIG. 2K is an enlarged view of a portion of FIG. 2J. As shown in FIG. 2K, the insulating material 225 is between each nanosheet stack 140 and the respective fin F thereunder. For example, the insulating material 225 may contact respective upper surfaces of the fins F and respective lower surfaces of the lowermost ones of the upper sacrificial layers SL-U that are alternately stacked with the nanosheets NS of the stacks 140.

Figure 2L:
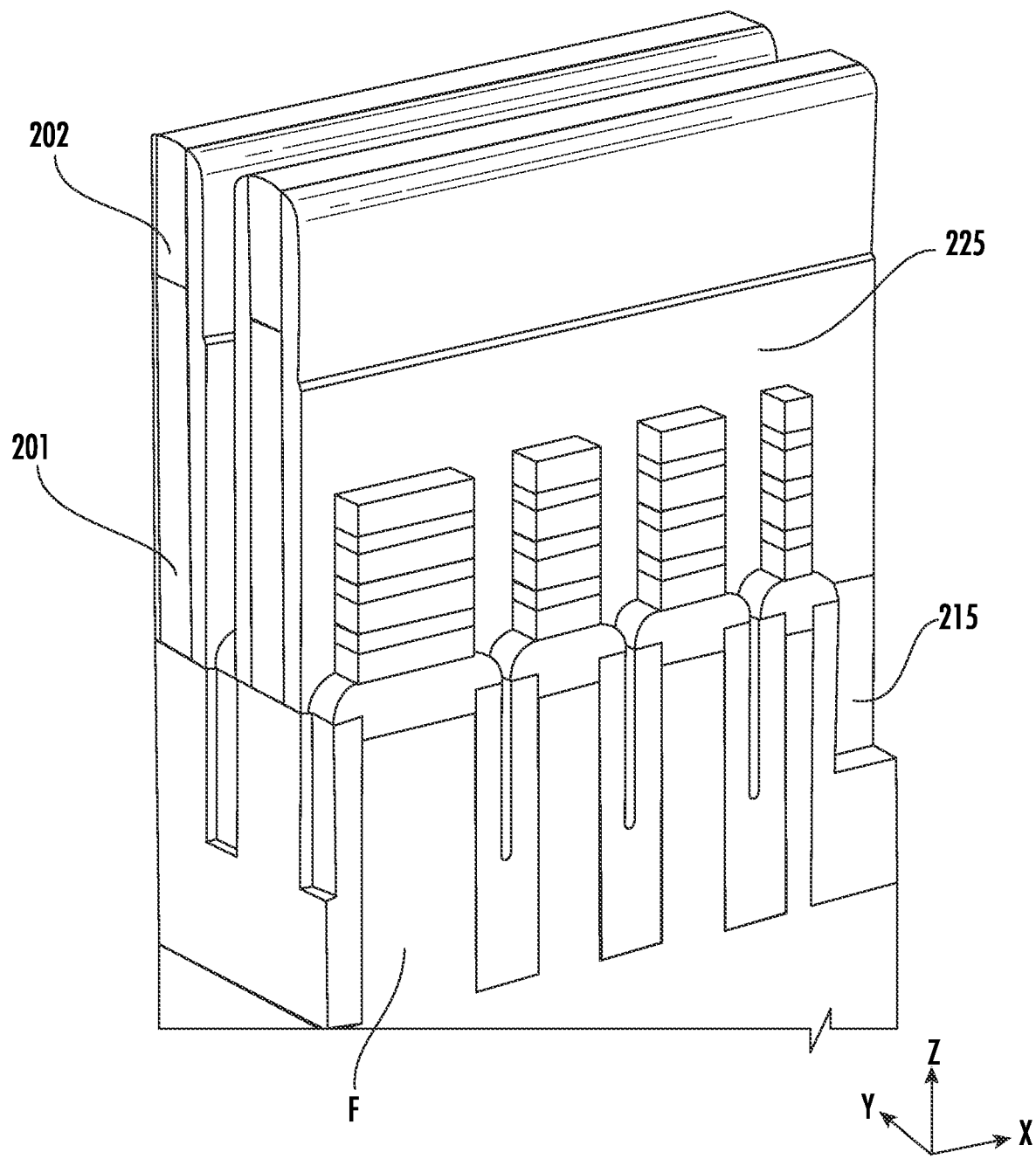

Referring to FIG. 2L, a spacer-etchback operation may be performed to remove some of the insulating material 225 while still covering sidewalls of the layers 201, 202 with the insulating material 225. For example, the insulating material 225 may be removed from the layer 203 (FIG. 2J). In some embodiments, the layer 203 may also be removed. As an example, the layer 203 and insulating material 225 may each comprise oxide and may be etched by an etchant that targets oxide.

Figure 2M:
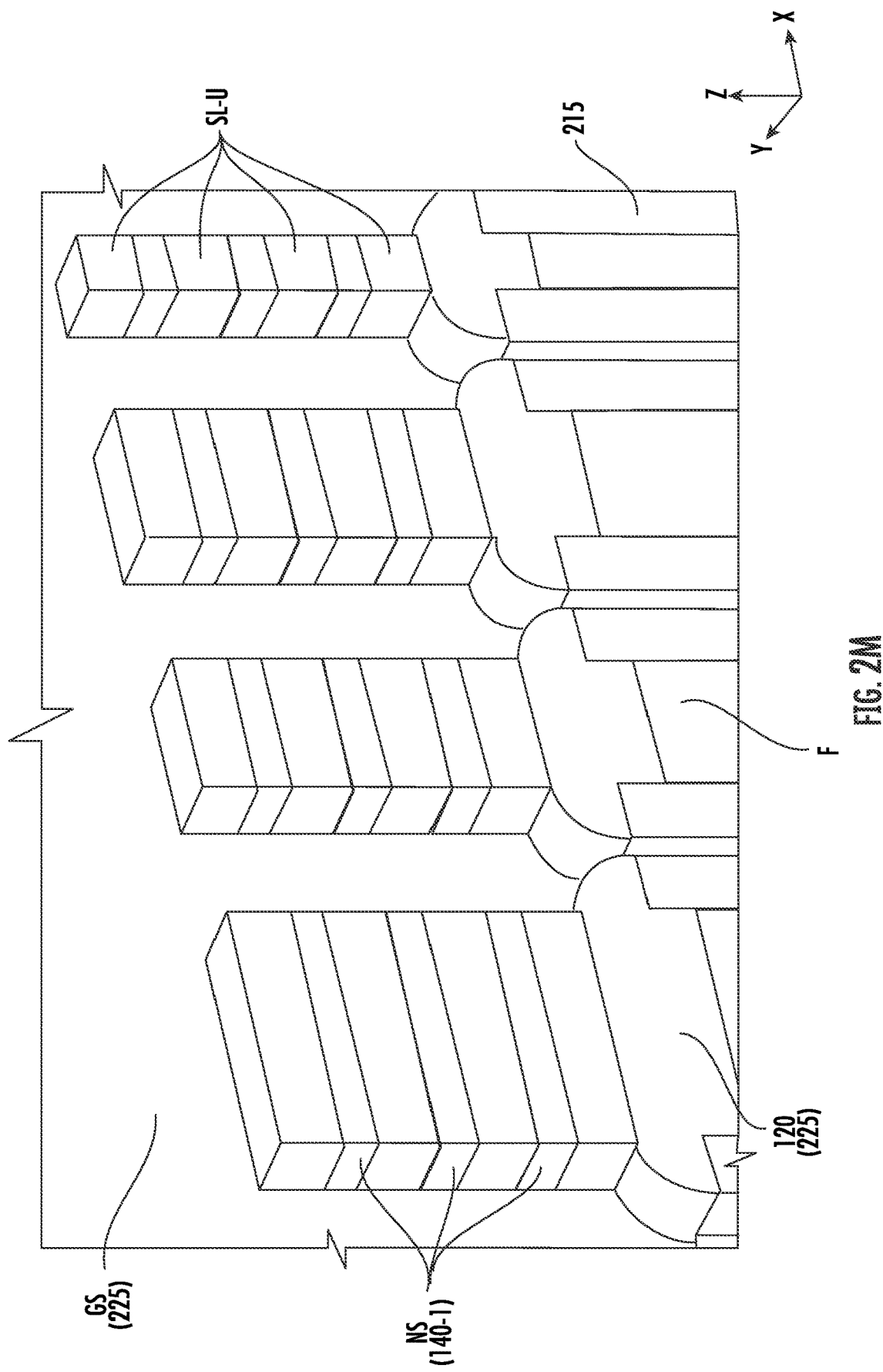

FIG. 2M is an enlarged view of a portion of FIG. 2L. As shown in FIGS. 2M and 3A, each gate spacer GS and each isolation region 120 are formed (Block 335) from portions of the insulating material 225 (i) on a stack 140 and (ii) in an opening 220H (FIG. 2I), respectively.

For example, FIG. 2M shows that the etchback operation may form a plurality of isolation regions 120 between, in the direction Z, respective nanosheet stacks 140 and respective fins F. In some embodiments, the isolation regions 120 may be spaced apart from each other in the direction X. Moreover, the etchback operation may form gate spacers GS on sidewalls of the layers 201, 202 (FIG. 2L). Accordingly, referring to FIG. 3B, forming the gate spacers GS and the isolation regions 120 may include forming (Block 335-A) the insulating material 225 (a) on the stacks 140 (and the layers 201, 202) and (b) in the openings 220H, respectively, and then performing (Block 335-B) the etchback operation on the insulating material 225. FIG. 2M also shows that portions of the stacks 140 and upper sacrificial layers SL-U that protrude outward in the direction Y beyond the gate spacers GS may be exposed by the etchback operation.

Figure 2N:
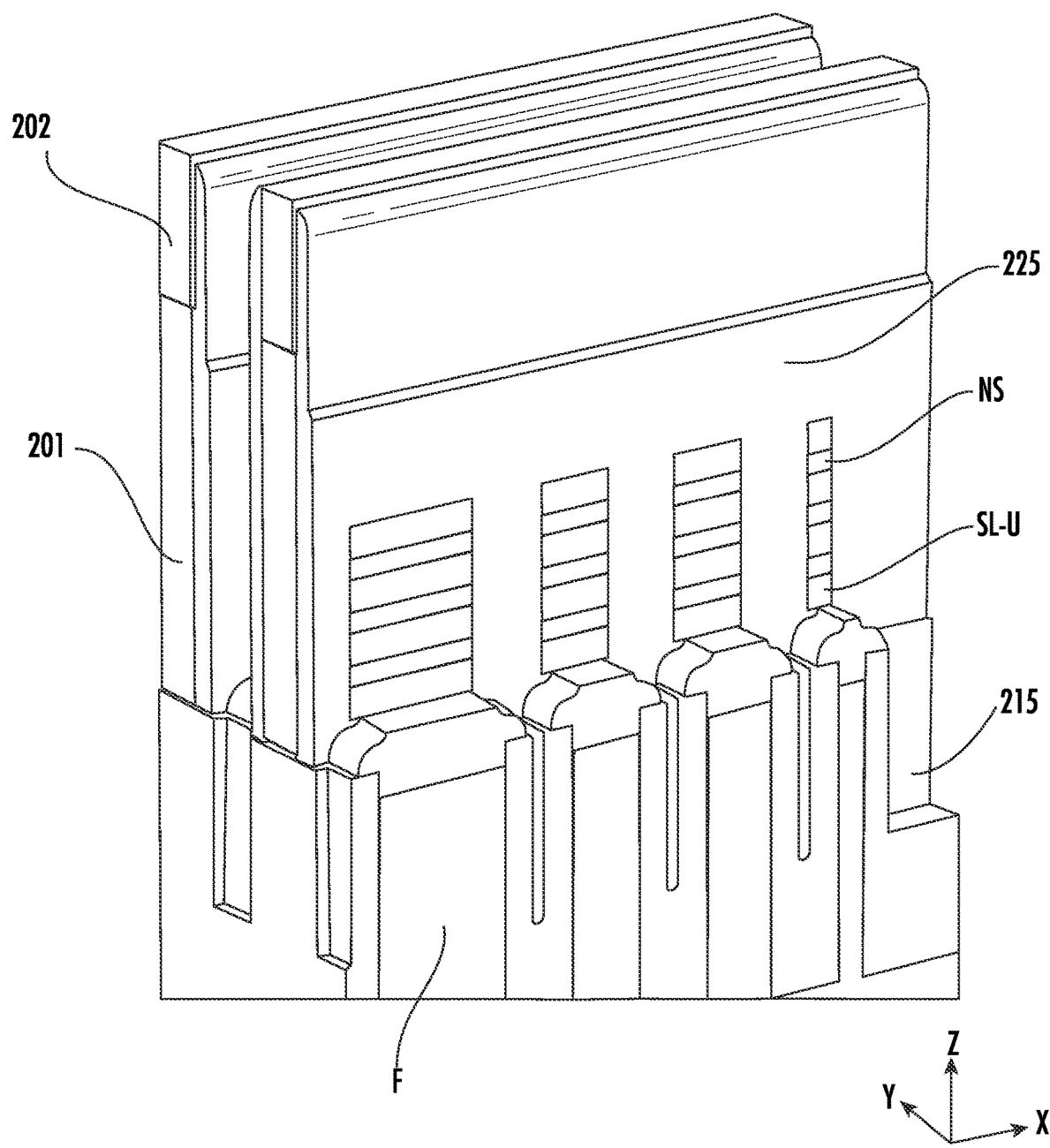
Figure 20:
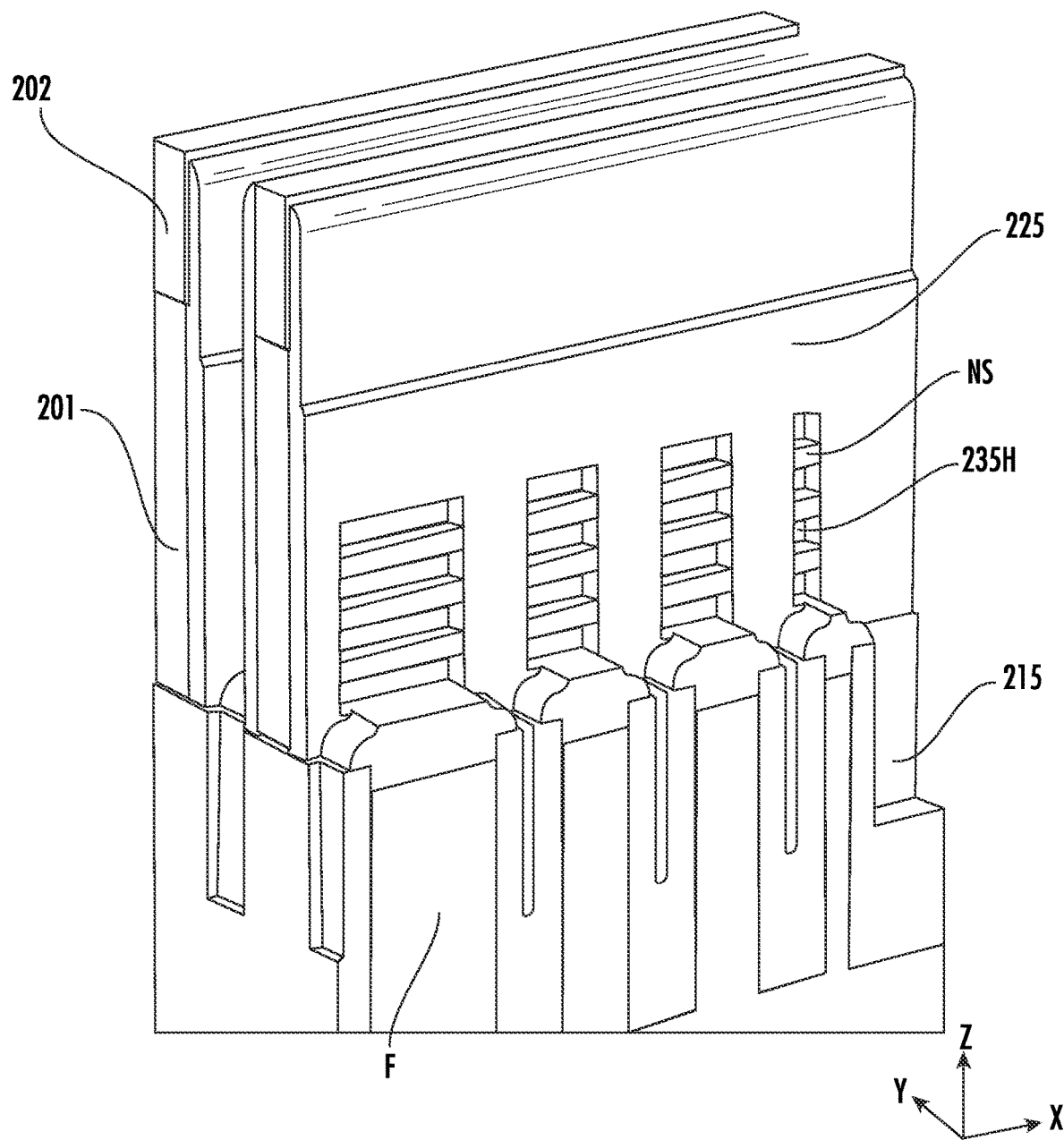
Figure 2P:
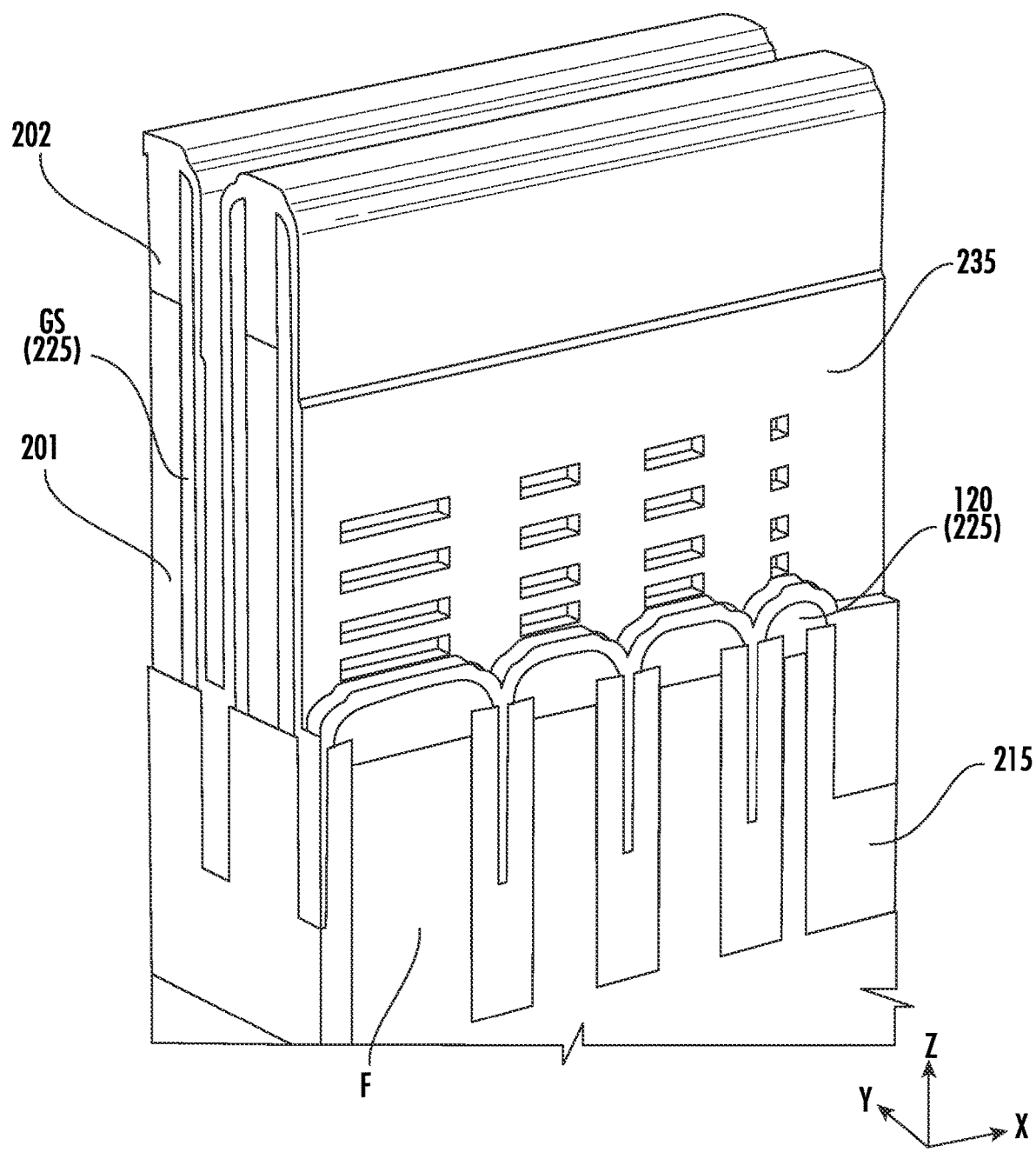

FIGS. 2N and 3B show that the exposed portions of the stacks 140 and upper sacrificial layers SL-U that protrude outward in the direction Y beyond the gate spacers GS may be recessed (Block 336). As a result, widths of the nanosheets NS and the upper sacrificial layers SL-U may be narrowed in the direction Y.

Referring to FIGS. 2O and 3B, cavities 235H may be formed (Block 337) above and below the nanosheets NS. For example, an etchant that targets SiGe may be used to form the cavities 235H by etching exposed side surfaces of the upper sacrificial layers SL-U (FIG. 2N). The upper sacrificial layers SL-U may have etch selectivity with respect to the nanosheets NS, the gate spacers GS (FIG. 2M), the layers 201, 202, and the isolation regions 120 (FIG. 2M). As a result of the etching, the cavities 235H may be formed between, in the direction Z, adjacent ones of the nanosheets NS.

As shown in FIGS. 2P and 3B, an insulating material 235 (Block 338) may be formed in the cavities 235H (FIG. 2O), on sidewalls of the gate spacers GS, and on respective upper surfaces of the isolation regions 120. In some embodiments, the insulating material 235 may comprise a different material from the insulating material 225 that forms the gate spacers GS and the isolation regions 120. As an example, the insulating material 235 may comprise SiN, and thus may have etch selectivity with respect to the gate spacers GS and the isolation regions 120. Moreover, the insulating material 235 may, in some embodiments, comprise the same material as the layer 202. The insulating material 235 may be formed by, for example, deposition on the sidewalls of the gate spacers GS. As an example, the insulating material 235 may be formed by a very uniform deposition, and its deposited thickness may be sufficient to close cavity gaps 235H (FIG. 2O) but not so thick that pinch-off occurs in a source/drain opening.

Figure 2Q:
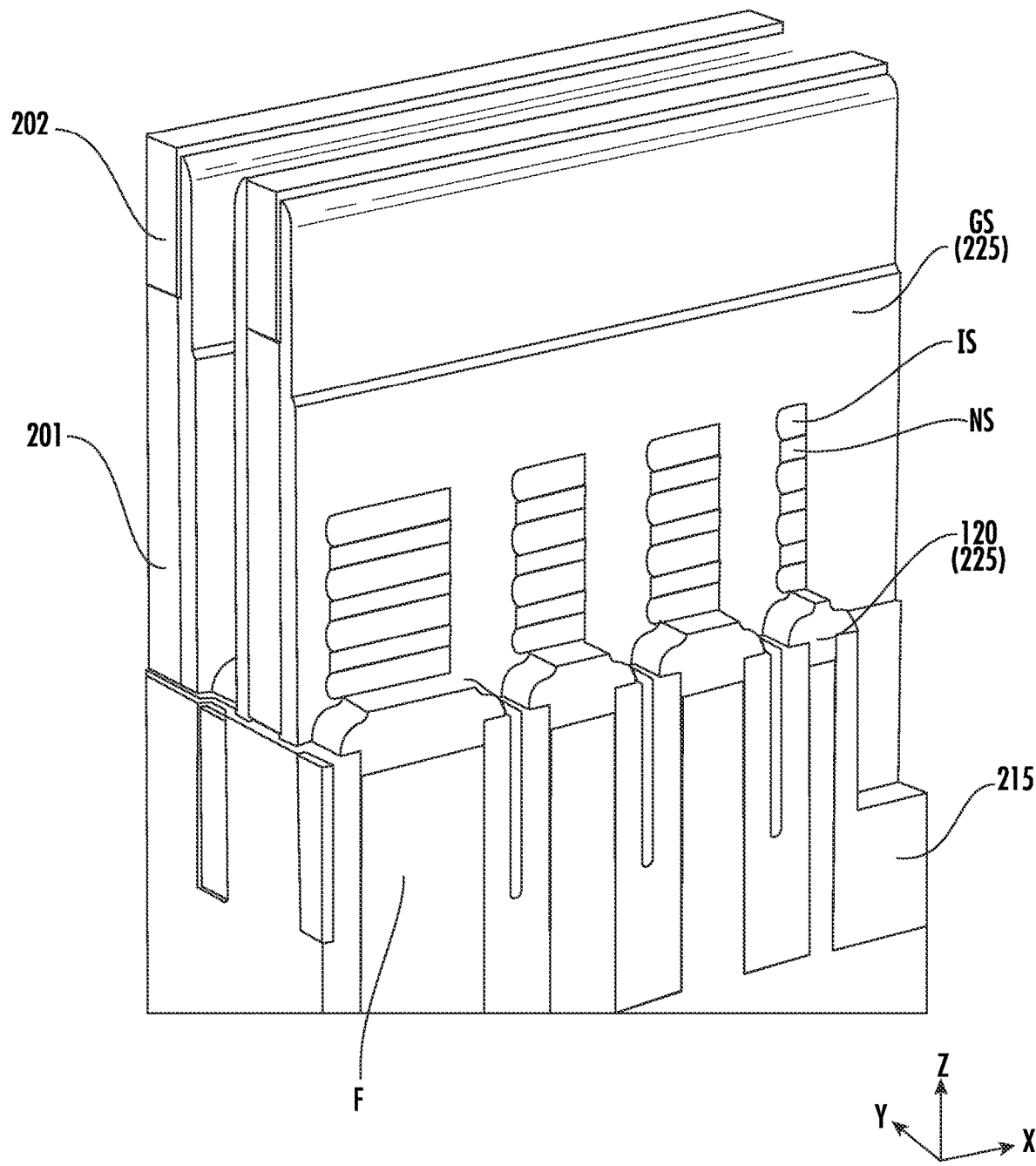

Referring to FIGS. 2Q and 3B, the insulating material 235 may be etched back (Block 339). As a result, the insulating material 235 may be removed from the sidewalls of the gate spacers GS, thereby exposing the sidewalls of the gate spacers GS and forming inner spacers IS in the cavities 235H (FIG. 2O). The inner spacers IS, however, are optional, and thus may be omitted (as may the insulating material 235 and the cavities 235H) in some embodiments.

Figure 2R:
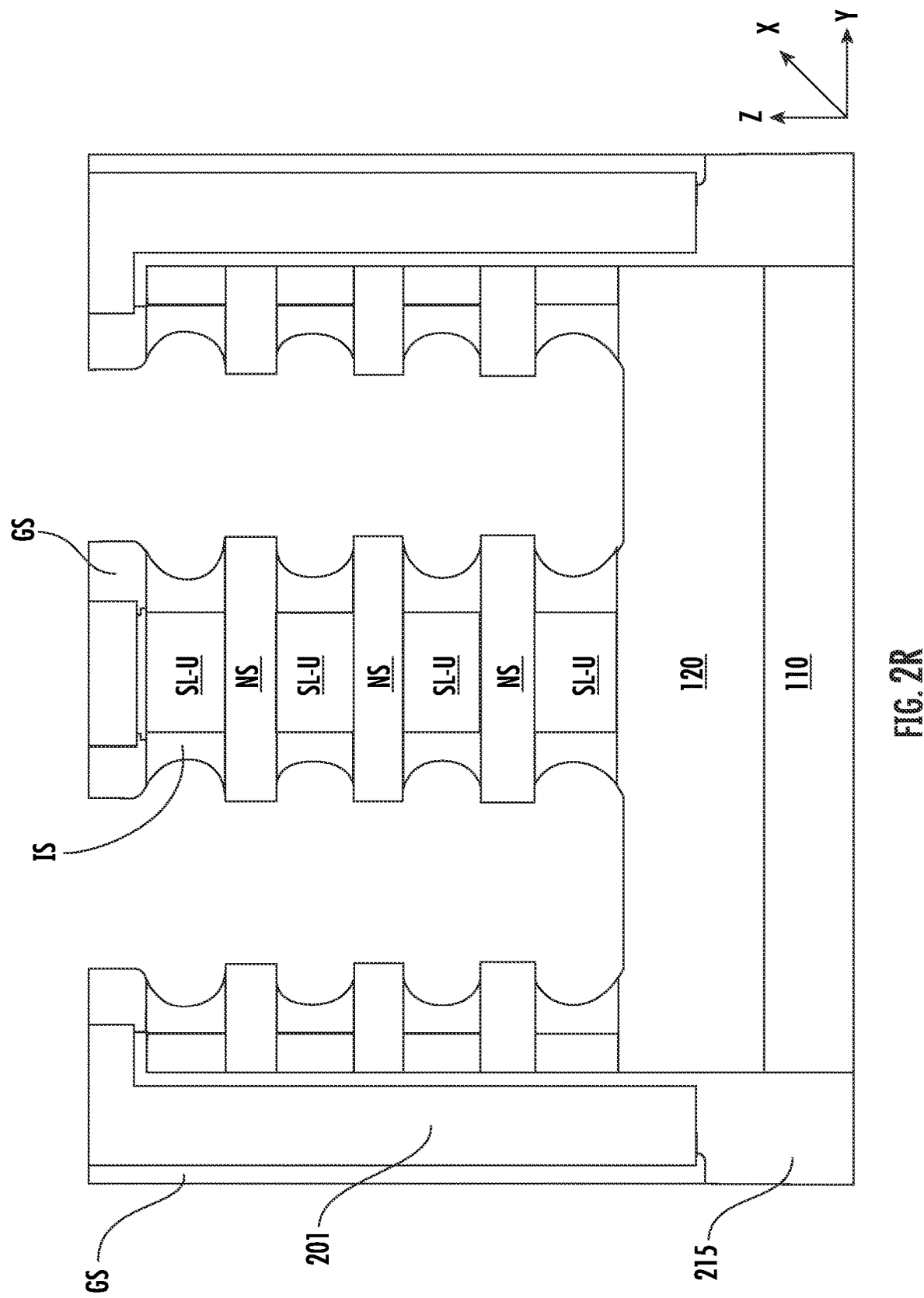

FIG. 2R is a view along the direction Y after performing the etchback to form the inner spacers IS. As shown in FIG. 2R, a sidewall of each upper sacrificial layer SL-U may be on (e.g., in contact with), in the direction Y, a sidewall of one of the inner spacers IS.

Figure 2S:
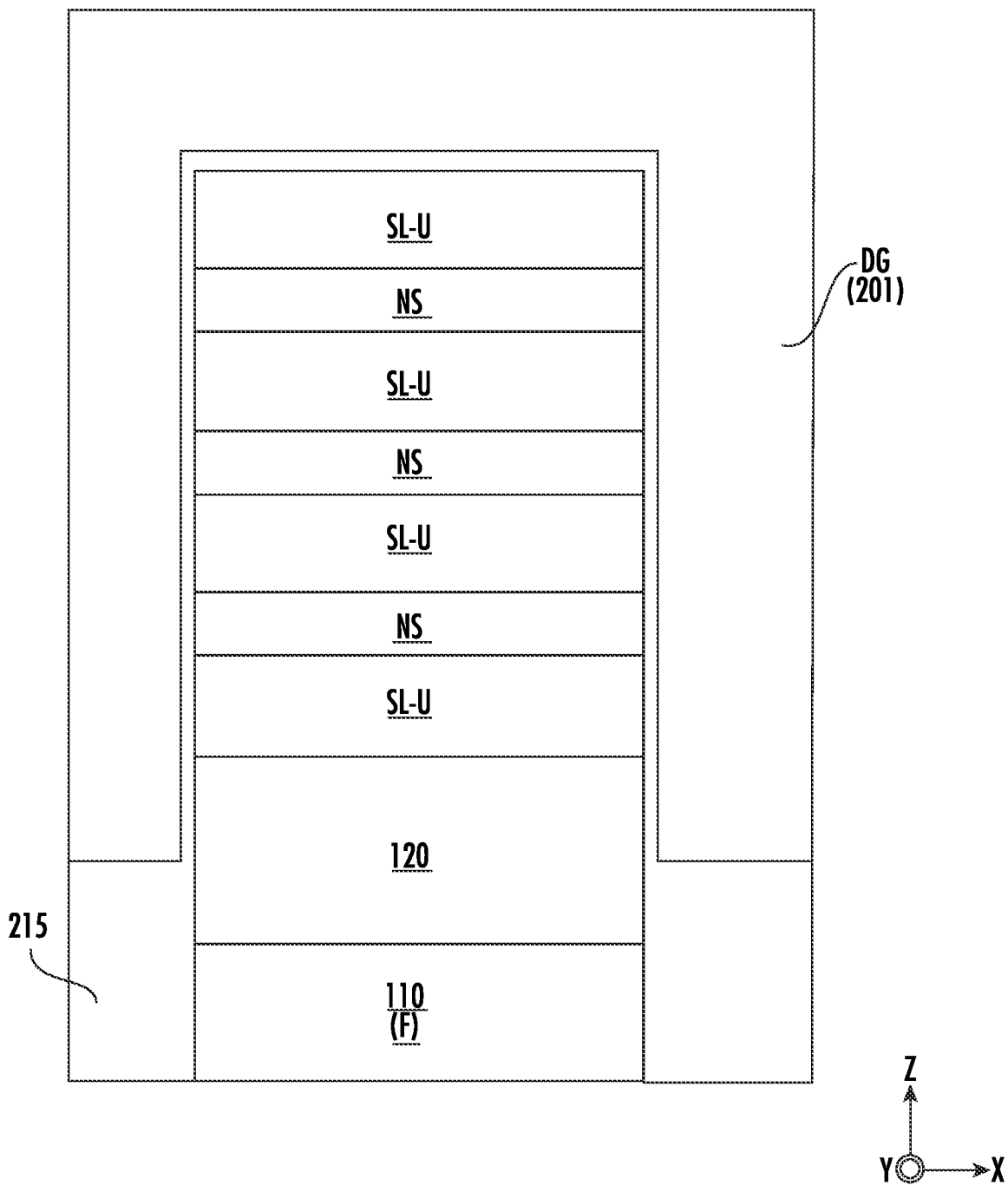
FIG. 2S is a cross-sectional view.

FIG. 2S is a cross-sectional view along the direction X through a layer 201 of a dummy gate DG. For simplicity of illustration, only one stack 140 (FIG. 2D) of nanosheets NS is shown in FIG. 2S. An isolation region 120 is between, in the direction Z, the stack 140 and a fin F. Moreover, inner spacers IS (FIG. 2Q) are not shown in FIG. 2S, as the cross-section shown in FIG. 2S is through the dummy gate DG along the direction X, and the inner spacers IS are spaced apart from the layer 201 of the dummy gate DG in the direction Y. In some embodiments, an STI region 215 may be on a lower portion of a sidewall of the isolation region 120, and the dummy gate DG may be on an upper portion of the sidewall of the isolation region 120, as shown in FIG. 2S.

FIGS. 2T and 2U are side perspective and side views, respectively, according to different embodiments. Referring to FIGS. 2T and 3B, source/drain regions 150-1, 150-2 may be formed (Block 340) between the inner spacers IS. For example, the source/drain regions 150-1, 150-2 may be epitaxially grown from the nanosheets NS. In some embodiments, the source/drain regions 150-1, 150-2 may contact the nanosheets NS, the inner spacers IS, and an upper surface of the isolation region 120.

FIG. 2U shows that source/drain regions 150 may, in other embodiments, contact the nanosheets NS and not contact the isolation region 120. Moreover, inner spacers IS (FIG. 2T) may be omitted from the device 100, and the source/drain regions 150 thus may not contact inner spacers IS. Omitting the inner spacers IS may be advantageous because the inner spacers IS can inhibit epitaxial growth of the source/drain regions 150.

As shown in FIGS. 2U, 2W, and 3C, a semiconductor layer 130 may be formed (Block 310-B) on an upper surface of the bottom sacrificial layer SL-B (FIG. 2A) before forming the upper sacrificial layers SL-U (FIG. 2A). For example, referring to FIG. 2W, which illustrates an alternative to the operation shown in FIG. 2A, the semiconductor layer 130 may be epitaxially grown from the bottom sacrificial layer SL-B. In some embodiments, the semiconductor layer 130 may be an Si layer and may be thinner, in the direction Z, than the bottom sacrificial layer SL-B. Moreover, the semiconductor layer 130 may be thinner, in the direction Z, than each of the upper sacrificial layers SL-U.

The semiconductor layer 130 may facilitate single crystal surface epitaxial growth. Accordingly, source/drain regions 150 may be epitaxially grown from the semiconductor layer 130. The semiconductor layer 130 may provide improved epitaxial growth and strain relaxation relative to embodiments in which the source/drain regions 150 are formed between inner spacers IS, as the isolation region 120 and the inner spacers IS can inhibit epitaxial growth. In addition, the semiconductor layer 130 can function (e.g., operate) as a fully depleted silicon on insulator ("FDSOI") channel region, to boost the existing nanosheet transistor drive. Moreover, the nanosheets NS may be configured to operate as respective channel regions that are above, in the direction Z, the FDSOI channel region. Accordingly, the FDSOI channel region may be between the isolation region 120 and the channel regions that are provided by the nanosheets NS. For simplicity of illustration, a first source/drain region 150-1 is shown in FIG. 2U and a second source/drain region 150-2 (FIG. 1B) is omitted from view in FIG. 2U to show a portion 130P of an upper surface of the semiconductor layer 130 from which the second source/drain region 150-2 may be epitaxially grown.

In some embodiments, the preliminary nanosheet stack 140-P and the upper sacrificial layers SL-U may be formed (Block 310-C) after forming (Block 310-B) the semiconductor layer 130. Operations that are shown in FIGS. 2B-2N may be performed while the semiconductor layer 130 is under the preliminary nanosheet stack 140-P and the upper sacrificial layers SL-U. Before forming (Block 335) an isolation region 120 in an opening 220H (FIGS. 2H-2M), the bottom sacrificial layer SL-B may be removed (Block 330) to form the opening 220H between the semiconductor layer 130 and an upper surface of a fin F. Moreover, the isolation region 120 may be formed (Block 335) before forming (Block 340) the source/drain regions 150. A lower surface of the semiconductor layer 130 may contact an upper surface of the isolation region 120 after forming (Block 335) the gate spacer GS, as shown in FIG. 2U.

Figure 2V:
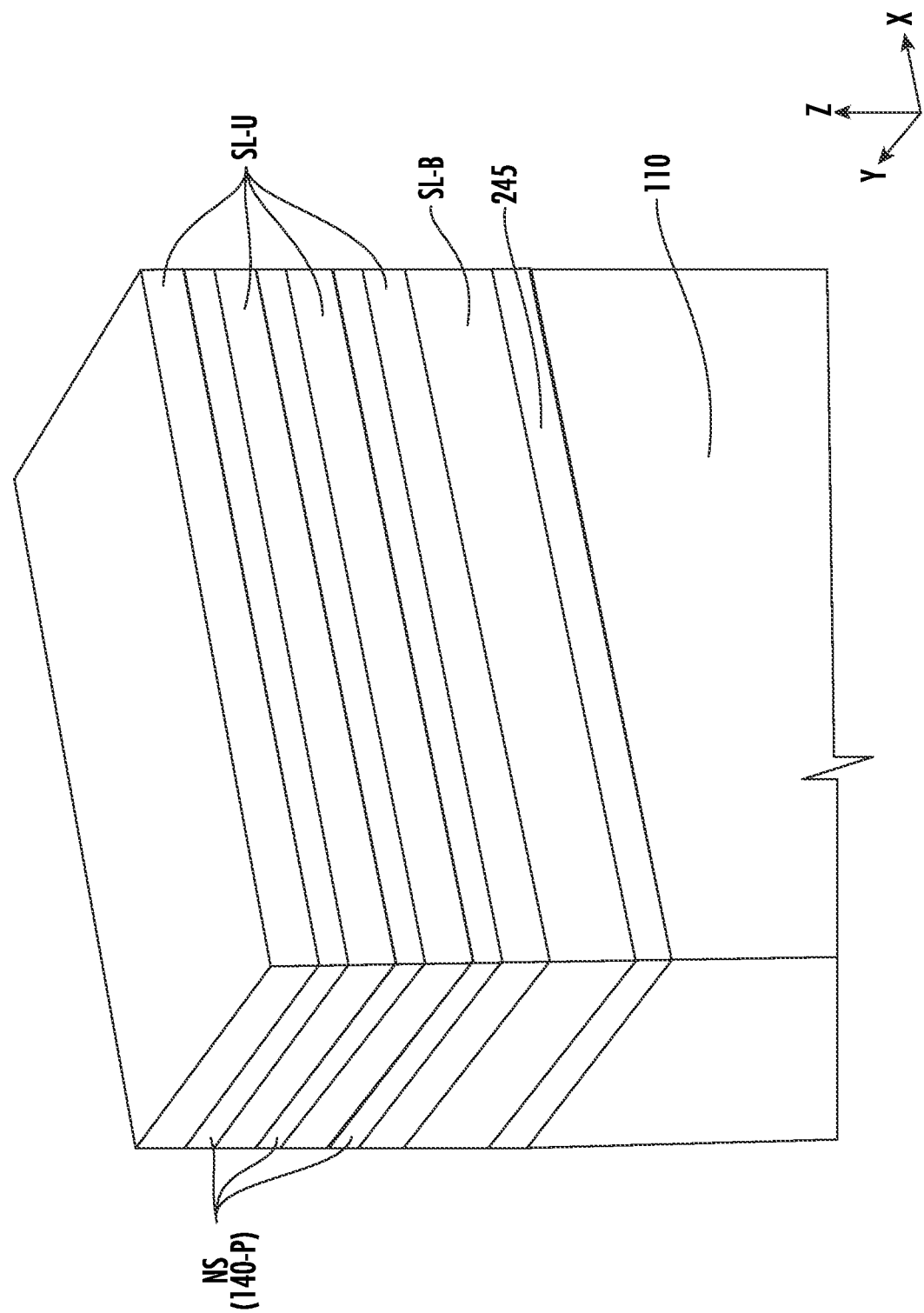

FIG. 2V is a side perspective view illustrating an alternative to the operation shown in FIG. 2A. As shown in FIGS. 2V and 3C, a buffer layer 245 may be formed (Block 305) on an upper surface of the substrate 110 before forming (Block 310-A) the bottom sacrificial layer SL-B. For example, instead of performing substitutional carbon doping to reduce lattice strain, the buffer layer 245 may support deposition of the bottom sacrificial layer SL-B without relaxation. The buffer layer 245 may be a strain-relaxed buffer layer comprising, for example, SiGe, and may have a lower Ge concentration than the bottom sacrificial layer SL-B. As an example, the buffer layer 245 may have a Ge concentration of about 30%. This buffer layer 245 may have a gradient Ge distribution in which a concentration of Ge is lower adjacent the substrate 110 and gradually increases along the direction Z to about 30% near the top surface of the buffer layer 245, and the buffer layer 245 may be fully relaxed.

For simplicity of illustration, formation of the buffer layer 245 is omitted from the flowchart in FIG. 3B. In some embodiments, however, the buffer layer 245 may be formed in a device 100 that is implemented with inner spacers IS that are formed in accordance with the flowchart in FIG. 3B. For example, the buffer layer 245 may be formed before forming the bottom sacrificial layer SL-B and before forming the inner spacers IS. For further simplicity of illustration, the semiconductor layer 130 (FIG. 2W), which is formed in accordance with the flowchart in FIG. 3C, is omitted from view in FIG. 2V.

Referring to FIGS. 3A-3C, a gate electrode G (FIGS. 1A, 1B) may, in some embodiments, be formed (Block 345) after forming (Block 340) source/drain regions 150. For example, the gate electrode G may be formed by replacing the dummy gate DG (FIGS. 2T, 2U) with a gate material (e.g., metal). Moreover, forming the gate electrode G may include replacing the upper sacrificial layers SL-U (FIGS. 2T, 2U) with the gate material. As a result, the gate electrode G may be on an upper surface of the semiconductor layer 130 (FIG. 2U) and/or on an upper surface of the isolation region 120 (FIGS. 2T, 2U). Moreover, the gate electrode G may be between the nanosheets NS (FIGS. 2T, 2U).

Methods of forming nanosheet transistor devices 100 (FIGS. 1A, 1B) according to embodiments of the present invention may provide a number of advantages. These advantages include reducing current leakage with respect to a fin F (FIG. 2B) that underlies nanosheets NS (FIG. 2I), by removing a bottom sacrificial layer SL-B (FIGS. 2G, 2H) that is between the fin F and the nanosheets NS before depositing an insulating material 225 (FIG. 2J) from which gate spacers GS (FIG. 2M) are formed. The insulating material 225 also provides an isolation region 120 (FIG. 2M) that is between the fin F and the nanosheets NS. Unlike conventional punch-through stop implantation, the isolation region 120 may not increase capacitance of a device 100. Rather, integrating the isolation region 120, instead of a conventional punch-through stop layer, under the nanosheets NS can facilitate gate length scaling with less leakage and lower capacitance, thereby enabling faster performance and lower energy use by the device 100. Further advantages include the ease with which the methods of the present invention may be integrated with conventional semiconductor fabrication processes.

Moreover, in some embodiments, source/drain epitaxial quality, which may be affected by the isolation region 120 and/or by inner spacers IS (FIG. 2T), may be improved by omitting the inner spacers IS and by growing source/drain regions 150 (FIG. 2U) from a semiconductor layer 130 (FIG. 2U) that is on top of the isolation region 120 and under the nanosheets NS.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present invention are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present invention should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A method of forming a transistor device, the method comprising:
    providing a sacrificial layer and a nanosheet stack on a substrate, wherein the sacrificial layer is between the nanosheet stack and the substrate, and wherein the nanosheet stack comprises a plurality of nanosheets;

removing the sacrificial layer to form an opening between the nanosheet stack and the substrate; and forming a gate spacer and an isolation region by concurrently forming an insulating material on the nanosheet stack and in the opening, respectively.

2. The method of claim 1,
wherein the sacrificial layer is a bottom sacrificial layer,
wherein a plurality of upper sacrificial layers are alternately stacked with the nanosheets, and
wherein the bottom sacrificial layer has a higher germanium concentration than each of the upper sacrificial layers.

3. The method of claim 2, further comprising replacing the upper sacrificial layers with a gate material after forming the gate spacer.

4. The method of claim 2, wherein a semiconductor layer is between the bottom sacrificial layer and the upper sacrificial layers.

5. The method of claim 4,
wherein the semiconductor layer is configured to operate as a channel region, and
wherein the nanosheets are configured to operate as respective channel regions.

6. The method of claim 4, wherein the semiconductor layer is configured to operate as a fully depleted silicon on insulator (FDSOI) channel region.

7. The method of claim 4, further comprising forming the semiconductor layer by epitaxial growth from the bottom sacrificial layer.

8. The method of claim 7, further comprising forming a plurality of source/drain regions by epitaxial growth from the semiconductor layer.

9. The method of claim 4, wherein the semiconductor layer contacts the isolation region, after forming the gate spacer.

10. The method of claim 1, wherein a buffer layer is between the sacrificial layer and the substrate.

11. The method of claim 10, wherein the sacrificial layer has a higher germanium concentration than the buffer layer and is formed after forming the buffer layer.

12. A method of forming a transistor device, the method comprising:
providing a sacrificial layer and a nanosheet stack on a substrate, wherein the sacrificial layer is between the nanosheet stack and the substrate, and wherein the nanosheet stack comprises a plurality of nanosheets;
epitaxially growing a semiconductor layer from the sacrificial layer;
removing the sacrificial layer to form an opening between the semiconductor layer and the substrate; and
forming an isolation region by forming an insulating material in the opening.

13. The method of claim 12, wherein the semiconductor layer is configured to operate as a fully depleted silicon on insulator (FDSOI) channel region.

14. The method of claim 13, wherein the nanosheets are configured to operate as respective channel regions that are above the FDSOI channel region.

15. The method of claim 12, further comprising forming a plurality of source/drain regions by epitaxial growth from the semiconductor layer.

16. The method of claim 12, further comprising forming a gate material between the nanosheets,
wherein, after forming the gate material, a first surface of the semiconductor layer contacts the isolation region, and the gate material is on a second surface of the semiconductor layer, and
wherein a gate spacer is formed concurrently with the isolation region.

* * * * *